(12) United States Patent
Spindler et al.

(10) Patent No.: US 8,179,035 B2
(45) Date of Patent: May 15, 2012

(54) SELECTING WHITE POINT FOR OLED DEVICES

(75) Inventors: Jeffrey P. Spindler, Rochester, NY (US); Tukaram K. Hatwar, Penfield, NY (US); Michele L. Ricks, Rochester, NY (US)

(73) Assignee: Global OLED Technology LLC, Wilmington, DE (US)

( * ) Notice: Subject to any disclaimer, the term of this patent is extended or adjusted under 35 U.S.C. 154(b) by 830 days.

(21) Appl. No.: 11/959,493

(22) Filed: Dec. 19, 2007

(65) Prior Publication Data

US 2008/0093989 A1   Apr. 24, 2008

Related U.S. Application Data

(62) Division of application No. 10/990,865, filed on Nov. 17, 2004.

(51) Int. Cl.
*H01L 51/54* (2006.01)
*H05B 33/14* (2006.01)
*C09K 11/06* (2006.01)

(52) U.S. Cl. ........ 313/504; 313/506; 428/690; 428/917; 257/40; 257/E51.047

(58) Field of Classification Search .................. None
See application file for complete search history.

(56) References Cited

U.S. PATENT DOCUMENTS

| | | | |
|---|---|---|---|
| 4,769,292 A | 9/1988 | Tang et al. | |
| 4,885,211 A | 12/1989 | Tang et al. | |
| 5,121,029 A | 6/1992 | Hosokawa et al. | |
| 5,405,709 A | 4/1995 | Littman et al. | |
| 5,683,823 A | 11/1997 | Shi et al. | |
| 6,004,685 A | 12/1999 | Antoniadis et al. | |
| 6,111,270 A * | 8/2000 | Xu et al. | 257/72 |
| 6,281,634 B1 | 8/2001 | Yokoyama | |
| 6,392,340 B2 | 5/2002 | Yoneda et al. | |
| 6,875,524 B2 | 4/2005 | Hatwar et al. | |
| 6,967,062 B2 | 11/2005 | Hatwar et al. | |
| 7,012,588 B2 | 3/2006 | Siwinski | |
| 2002/0186214 A1 | 12/2002 | Siwinski | |
| 2003/0137241 A1 | 7/2003 | Fujita et al. | |
| 2003/0201415 A1* | 10/2003 | Hoag et al. | 251/40 |
| 2004/0185300 A1 | 9/2004 | Hatwar et al. | |
| 2005/0048311 A1 | 3/2005 | Hatwar et al. | |

FOREIGN PATENT DOCUMENTS

| | | |
|---|---|---|
| GB | 2 340 304 | 2/2000 |
| JP | 07-142169 | 6/1995 |
| JP | 11-233261 | 8/1999 |
| JP | 2002-237386 | 8/2002 |

OTHER PUBLICATIONS

Zhi-lin et al., J. Phys. D: Appl. Phys. 31 (1998) 32-35.*
U.S. Appl. No. 10/812,787, filed Mar. 29, 2004 by Michael E. Miller, et al., entitled "A Color OLED Display With Improved Power Efficiency".

(Continued)

*Primary Examiner* — Jennifer Chriss
*Assistant Examiner* — Brett A Crouse
(74) *Attorney, Agent, or Firm* — McKenna Long & Aldridge LLP

(57) ABSTRACT

A method for selecting two different light-emitting materials for use in an OLED device, each of which produces different color light, which combine to produce white light. Each light emitting material has its own point on a chromaticity diagram, and the light-emitting materials are selected such that, when a line is drawn between the first point and the second point, it passes through a desired white area defined on a chromaticity diagram.

6 Claims, 5 Drawing Sheets

OTHER PUBLICATIONS

Jeffrey P. Spindler et al., 4.3:Lifetime-and Power-Enhanced RGBW Displays Based on white OLEDs, 2005 SID Internation Symposium, Boston, Symposium, San Jose, CA, May 24, 2005, pp. 36-39, XP007012166.

T. K. Hatwar et al., Development in OLED Formulations with Improved Efficiency and Stability, Proceedings of the SPIE, SPIE, Bellingham, VA, vol. 5519, Aug. 2, 2004, pp. 1-11, XP008059666.

SeongDeok Lee et al., Color Conversion from RGB to RGB+White While Preserving Hue and Saturation, Proceedings fo the Color Imaging Conference: Color Science, Systems, and Applications, Nov. 12, 2002, pp. 287-291, XP008061670.

Retrieved from the Internet: URL:http://en.wikipedia.org/wiki/CIE_XYZ_color_space, CIE 1931 Color Space, Mar. 7, 2006, XP007900273.

* cited by examiner

SELECTING WHITE POINT FOR OLED DEVICES

CROSS REFERENCE TO RELATED APPLICATIONS

This application is a divisional of pending U.S. patent application Ser. No. 10/990,865 filed Nov. 17, 2004 entitled "Selecting White Point for OLED Devices" by Jeffrey P. Spindler et al.

Reference is made to commonly assigned U.S. patent application Ser. No. 10/780,436 filed Feb. 17, 2004 by Michele L. Ricks, et al., entitled "Anthracene Derivative Host Having Ranges of Dopants", commonly assigned U.S. patent application Ser. No. 10/801,997 filed Mar. 16, 2004 by William J. Begley, et al., entitled "White Organic Light-Emitting Devices With Improved Performance", commonly assigned U.S. patent application Ser. No. 10/838,665 filed May 4, 2004 by Tukaram K. Hatwar, et al., entitled "Improved Tuned Microcavity Color OLED Display", and commonly assigned U.S. patent application Ser. No. 10/869,115 filed Jun. 16, 2004 by Michele L. Ricks, et al., entitled "Array of Light-Emitting OLED Microcavity Pixels", the disclosures of which are herein incorporated by reference.

FIELD OF THE INVENTION

The present invention relates to white light-emitting organic light-emitting diode (OLED) devices comprising two different light-emitting layers.

BACKGROUND OF THE INVENTION

An organic light-emitting diode device, also called an OLED device, commonly includes a substrate, an anode, a hole-transporting layer made of an organic compound, an organic luminescent layer with suitable dopants, an organic electron-transporting layer, and a cathode. OLED devices are attractive because of their low driving voltage, high luminance, wide-angle viewing and capability for full color flat emission displays. Tang et al. described this multilayer OLED device in their U.S. Pat. Nos. 4,769,292 and 4,885,211.

There is a continuing need for efficient, stable, robust formulations for broadband light-emitting OLED devices. By broadband light, it is meant that the OLED emits sufficient light throughout the spectrum so that such light can be used in conjunction with filters to produce a full color display. In particular, there is a need for white light-emitting OLEDs where there is substantial emission in the red, green, and blue portions of the spectrum, wherein a white-emitting electroluminescent (EL) layer can be used to form a multicolor device. Full color OLED devices are well known in the art. Typical full color OLED devices are constructed of three different color pixels that are red, green, and blue in color. Such an arrangement is known as an RGB design and the individual color pixels are deposited by the use of a precision shadow mask. An example of an RGB design is disclosed in U.S. Pat. No. 6,281,634. Another method is to use a white light-emitting device in conjunction with R, G, B color filters. A white-emitting electroluminescent (EL) layer can be used to form a multicolor device. Each pixel is coupled with a color filter element as part of a color filter array (CFA) to achieve a pixelated multicolor display. The organic EL layer is common to all pixels and the final color as perceived by the viewer is dictated by that pixel's corresponding color filter element. Therefore, a multicolor or RGB device can be produced without requiring any patterning of the organic EL layers. An example of a white CFA top-emitting device is shown in U.S. Pat. No. 6,392,340. Other examples of white-light-emitting OLED devices are disclosed in U.S. Pat. No. 5,683,823, JP 07-142169, and U.S. Pat. No. 5,405,709.

Full color organic electroluminescent (EL) devices have also recently been described that are constructed of four different color pixels that are red, green, blue, and white. Commonly assigned U.S. patent application Ser. No. 10/812,787 filed Mar. 29, 2004 by Michael E. Miller, et al., entitled "A Color OLED Display With Improved Power Efficiency", the disclosures of which are herein incorporated by reference, describe such four-pixel design. Such an arrangement is known as an RGBW design. An example of an RGBW device is disclosed in commonly assigned U.S. Patent Application Publication 2002/0186214 A1. In an RGBW device, high efficiency white-emitting pixels are used to display a portion of the digital image content. This results in improved power consumption relative to an RGB constructed of similar OLED materials. For this purpose a white emitter with white color close to the target white point of the display (typically D65) is desirable. Numerous OLEDs with alternative layer structures, including polymeric materials, have been disclosed, and device performance has been improved. For the commercial success of OLEDs, further improvement in devices is needed. Among the key areas that need further improvement to achieve lower power consumption and longer lifetime are the efficiency and operating stability of the devices. It is also desirable to improve the color gamut obtainable from such devices.

SUMMARY OF THE INVENTION

It is therefore an object of the present invention to provide a method of selecting emitters to provide an improved broadband organic light-emitting device wherein the broadband radiation can include light substantially in the white portion of the spectrum.

This object is achieved by a method for selecting two different light-emitting materials for use in an OLED device, each of which produces different color light, which combine to produce white light, comprising:

a) selecting a blue light emitting first material which has a first point on a chromaticity diagram within a first area defined by CIEx=0.10 to 0.20, CIEy=0.05 to 0.15;

b) selecting a yellow-orange emitting second material which has a second point on a chromaticity diagram within a second area defined by CIEx=0.42 to 0.57, CIEy=0.42 to 0.57 such that, when a line is drawn between the first point and the second point, it passes through a desired white area defined on a chromaticity diagram to be within CIEx=0.27 to 0.39, CIEy=0.27 to 0.39; and c) selecting the concentration of the selected first and second materials so that the white light produced by the OLED device is at a third point substantially on the line in the chromaticity diagram within the desired white area.

ADVANTAGES

It is an advantage of this invention that devices with effective initial white color (such as D65 white) can be obtained. It is an advantage of the present invention that it provides improved device efficiency, resulting in lower power consumption and longer lifetime. It is a further advantage for some embodiments of the present invention that such a device can be constructed using common OLED organic layers for all pixels, which does not require precision patterning of organic materials to form the pixels. Any device patterning necessary can be done as part of the formation of the active matrix components or passive matrix components by photolithographic methods, which are more precise methods than those commonly used to deposit organic layers. It is a further advantage for some embodiments of the present invention that an improved or extended color gamut is provided. This configuration permits for a four-pixel RGBW (red, green, blue, and white) configuration to be used in a bottom-emitting or top-emitting device, which further reduces the power consumption.

Since device feature dimensions such as layer thickness are frequently in submicrometer ranges, the drawings are scaled for ease of visualization rather than dimensional accuracy.

DETAILED DESCRIPTION OF THE INVENTION

The term "pixel" is employed in its art-recognized usage to designate an area of a display panel that can be stimulated to emit light independently of other areas. The term "OLED device" or "organic light-emitting display" is used in its art-recognized meaning of a display device comprising organic light-emitting diodes as pixels. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in the red, green, and blue regions of the visible spectrum and displaying images in combination of hues. The red, green, and blue colors constitute the three primary colors from which other colors can be produced by appropriate mixing. The term "hue" refers to the intensity profile of light emission within the visible spectrum, with different hues exhibiting visually discernible differences in color. The pixel is generally used to designate the smallest addressable unit in a display panel.

In accordance with this disclosure, broadband emission is light that has significant components in multiple portions of the visible spectrum, for example, blue and green. The term broadband emission will be understood to include the situation where light is emitted in the red, green, and blue portions of the spectrum in order to produce white light. White light is that light that is perceived by a user as having a white color, or light that has an emission spectrum sufficient to be used in combination with color filters to produce a multicolor or full color display. Although CIEx, CIEy coordinates of about 0.33, 0.33 can be ideal in some circumstances, the actual coordinates can vary significantly and still be very useful.

Figure 10:
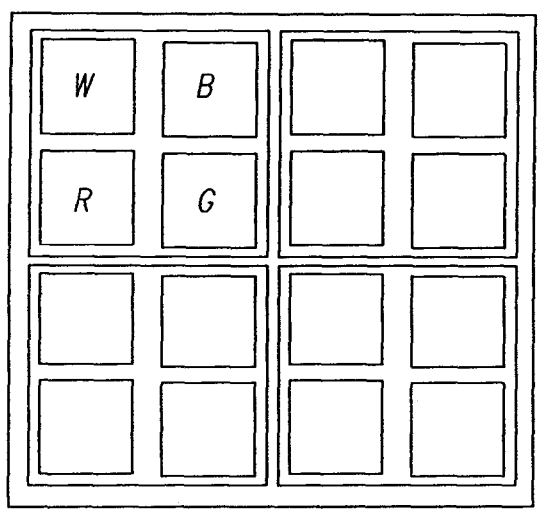
FIG. 10 is a RGBW display pixel pattern that can be used in accordance with the present invention.

It is sometimes useful to form displays comprising pixels of more than three different colors. The added color pixels can emit a color within the gamut defined by the other pixels, or can emit a color outside the gamut defined by the other pixels. RGBW displays shown in FIG. 10 are one example of a type of display that uses within-gamut emission to improve power consumption.

Figure 1:
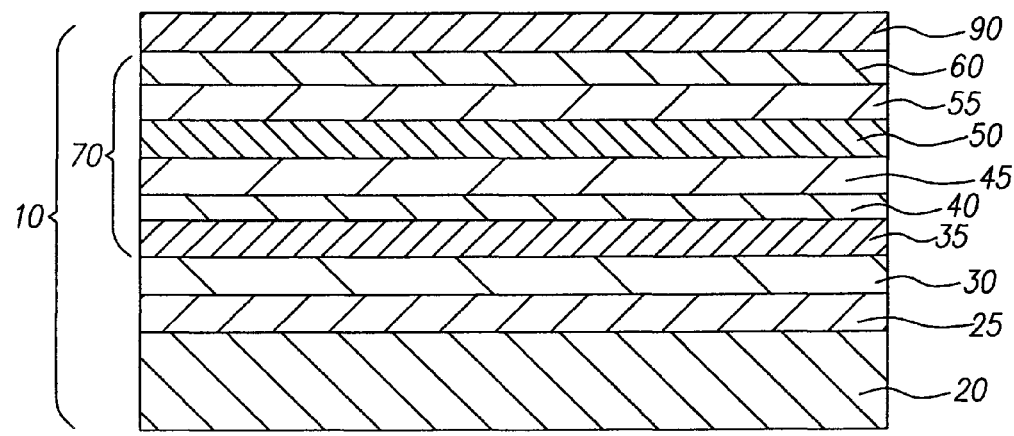
FIG. 1 is a cross-sectional view of an OLED device according to a first embodiment of this invention.

Turning now to FIG. 1, there is shown a cross-sectional view of a pixel of a light-emitting OLED device 10 that can be used according to a first embodiment of the present invention. The OLED device 10 is a broadband-emitting OLED device, and can be a white light-emitting OLED device, and includes at a minimum a substrate 20, an anode 30, a cathode 90 spaced from anode 30, a first light-emitting layer 45, and a second light-emitting layer 50. The first and second light-emitting layers emit different color light. If white light emission is desired, the first and second light-emitting layers typically emit complementary, or nearly complementary colors. The combination of light emission between the two light-emitting layers of a white light-emitting OLED device should cover most of the visible spectrum in order to produce useful white light. For example, the first light-emitting layer can emit yellow and the second light-emitting layer can emit blue. Other combinations such as red and cyan are possible. The OLED device 10 can also include color filter 25, a hole-injecting layer 35, a hole-transporting layer 40, an electron-transporting layer 55, and an electron-injecting layer 60. Hole-injecting layer 35, hole-transporting layer 40, light-emitting layers 45 and 50, electron-transporting layer 55, and electron-injecting layer 60 are organic layers that comprise organic EL element 70 that is disposed between anode 30 and cathode 90 and that, for the purposes of this invention, includes at least two different dopants for collectively emitting broadband light. These components will be described in more detail.

Substrate 20 can be an organic solid, an inorganic solid, or include organic and inorganic solids. Substrate 20 can be rigid or flexible and can be processed as separate individual pieces, such as sheets or wafers, or as a continuous roll. Typical substrate materials include glass, plastic, metal, ceramic, semiconductor, metal oxide, semiconductor oxide, or semiconductor nitride, or combinations thereof. Substrate 20 can be a homogeneous mixture of materials, a composite of materials, or multiple layers of materials. Substrate 20 can be an OLED substrate, that is a substrate commonly used for preparing OLED devices, e.g. active matrix low temperature polycrystalline silicon or amorphous-silicon TFT substrate. The substrate 20 can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing, or light reflective. Substrates for use in this case include, but are not limited to, glass, plastic, semiconductor materials, ceramics, and circuit board materials, or any others commonly used in the formation of OLED devices, which can be either passive matrix devices or active matrix devices.

An electrode is formed over substrate 20 and is most commonly configured as an anode 30. However, the OLED devices of this invention are not limited to this configuration, and can instead have a cathode as the first electrode. For the purposes of this discussion, the electrode adjacent to the substrate is considered the anode. When EL emission is viewed through the substrate 20, anode 30 should be transparent or substantially transparent to the emission of interest. Common transparent anode materials useful in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, metal selenides such as zinc selenide, and metal sulfides such as zinc sulfide, can be used as an anode material. For applications where EL emission is viewed through the top electrode, the transmissive characteristics of the anode material are immaterial and any conductive material can be used, transparent, opaque or reflective. Example conductors for this application include, but are not limited to, gold, iridium, molybdenum, palladium, and platinum. The preferred anode materials, transmissive or otherwise, have a work function of 4.1 eV or greater. Desired anode materials can be deposited by any suitable way such as evaporation, sputtering, chemical vapor deposition, or electrochemical means. Anode materials can be patterned using well known photolithographic processes.

Cathode 90 is formed over the electron-transporting layer 55 or over light-emitting layer 50 if an electron-transporting layer is not used. When light emission is through the anode 30, the cathode material can be comprised of nearly any conductive material. Desirable materials have effective film-forming properties to ensure effective contact with the underlying organic layer, promote electron injection at low voltage, and have effective stability. Useful cathode materials often contain a low work function metal (<3.0 eV) or metal alloy. One preferred cathode material is comprised of a Mg:Ag alloy wherein the percentage of silver is in the range of 1% to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861, 5,059,862, and 6,140,763.

When light emission is viewed through cathode 90, it should be transparent or nearly transparent. For such applications, metals should be thin or one should use transparent conductive oxides, or include these materials. Optically transparent cathodes have been described in more detail in U.S. Pat. Nos. 5,776,623 and 6,548,956. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Cathode 90 is spaced, meaning it is vertically spaced apart from anode 30. Cathode 90 can be part of an active matrix device and in that case is a single electrode for the entire display. Alternatively, cathode 90 can be part of a passive matrix device, in which each cathode 90 can activate a column of pixels, and cathodes 90 are arranged orthogonal to anodes 30.

Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

First and second light-emitting layers 45 and 50, respectively, produce light in response to hole-electron recombination and are commonly disposed over hole-transporting layer 40, although hole-transporting layer 40 is not required for the practice of this invention. Desired organic light-emitting materials can be deposited by any suitable way such as evaporation, sputtering, chemical vapor deposition, electrochemical means, or radiation thermal transfer from a donor material. Useful organic light-emitting materials are well known. As more fully described in U.S. Pat. Nos. 4,769,292 and 5,935,721, each of the light-emitting layers of the organic EL element includes a luminescent or fluorescent material where electroluminescence is produced as a result of electron-hole pair recombination in this region. It is also possible for recombination in one light-emitting layer to produce luminescence in another light-emitting layer by way of an energy transfer process. While light-emitting layers can be comprised of a single material, they more commonly include a host material doped with a guest compound or dopant where light emission comes primarily from the dopant. The practice of this invention concerns such host/dopant light-emitting layers and OLED devices. The dopant is selected to produce color light having a particular spectrum. The dopant is typically chosen from highly fluorescent dyes, and is typically coated as 0.01 to 10% by weight into the host material.

An important relationship for choosing a dye as a dopant is the value of the optical band gap, which is defined the energy difference between the emissive excited state and the ground state of the molecule and is approximately equal to the energy difference between the lowest unoccupied molecular orbital and the highest occupied molecular orbital of the molecule. For efficient energy transfer from the host material to the dopant molecule, or to prevent back-transfer of energy from the dopant to the host, a necessary condition is that the band gap of the dopant be smaller than that of the host material.

Emitting molecules known to be of use include, but are not limited to, those disclosed in U.S. Pat. Nos. 4,768,292, 5,141,671, 5,150,006, 5,151,629, 5,294,870, 5,405,709, 5,484,922, 5,593,788, 5,645,948, 5,683,823, 5,755,999, 5,928,802, 5,935,720, 5,935,721, 6,020,078, and 6,534,199.

First light-emitting layer 45 is provided over anode 30 and includes a first host material and a first light-emitting material. The first host material is a mixture of one or more mono-anthracene derivatives provided in a volume fraction range of 5% to 50% relative to the total host volume, and one or more aromatic amine derivatives provided in a volume fraction range of 50% to 95% relative to the total host volume.

The mono-anthracene derivative(s) in first light-emitting layer 45 can be derivatives of a single anthracene nucleus having hydrocarbon or substituted hydrocarbon substituents at the 9 and 10 positions. For example, derivatives of 9,10-di-(2-naphthyl)anthracene (Formula F) constitute one class of useful host materials capable of supporting electroluminescence, and are particularly suitable for light emission of wavelengths longer than 400 m, e.g., blue, green, yellow, orange or red

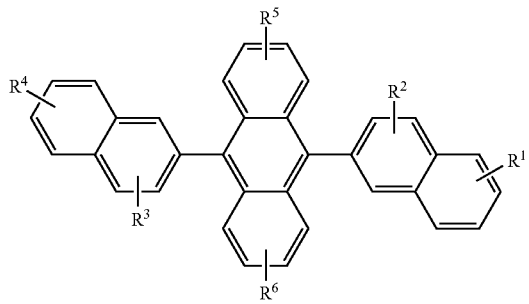

wherein $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl, pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

The mono-anthracene derivative of Formula (I) is also a useful host material capable of supporting electroluminescence, and is particularly suitable for light emission of wavelengths longer than 400 nm, e.g., blue, green, yellow, orange or red. Mono-anthracene derivatives of Formula (I) are described in commonly assigned U.S. patent application Ser. No. 10/693,121 filed Oct. 24, 2003 by Lelia Cosimbescu et al., entitled "Electroluminescent Device With Anthracene Derivative Host", the disclosure of which is herein incorporated by reference

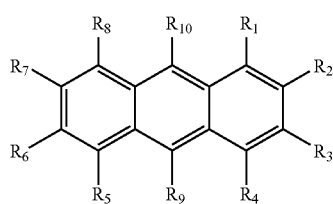

wherein:

$R_1$-$R_8$ are H; and $R_9$ is a naphthyl group containing no fused rings with aliphatic carbon ring members; provided that $R_9$ and $R_{10}$ are not the same, and are free of amines and sulfur compounds. Suitably, $R_9$ is a substituted naphthyl group with one or more further fused rings such that it forms a fused aromatic ring system, including a phenanthryl, pyrenyl, fluoranthene, perylene, or substituted with one or more substituents including fluorine, cyano group, hydroxy, alkyl, alkoxy, aryloxy, aryl, a heterocyclic oxy group, carboxy, trimethylsilyl group, or an unsubstituted naphthyl group of two fused rings. Conveniently, $R_9$ is 2-naphthyl, or 1-naphthyl substituted or unsubstituted in the para position; and $R_{10}$ is a biphenyl group having no fused rings with aliphatic carbon ring members. Suitably $R_{10}$ is a substituted biphenyl group, such that it forms a fused aromatic ring system including but not limited to a naphthyl, phenanthryl, perylene, or substituted with one or more substituents including fluorine, cyano group, hydroxy, alkyl, alkoxy, aryloxy, aryl, a heterocyclic oxy group, carboxy, trimethylsilyl group, or an unsubstituted biphenyl group. Conveniently, $R_{10}$ is 4-biphenyl, 3-biphenyl unsubstituted or substituted with another phenyl ring without fused rings to form a terphenyl ring system, or 2-biphenyl. Particularly useful is 9-(2-naphthyl)-10-(4-biphenyl)anthracene.

It has been found in commonly assigned U.S. patent application Ser. No. 10/693,121 filed Oct. 24, 2003 by Lelia Cosimbescu et al., entitled "Electroluminescent Device With Anthracene Derivative Host", the disclosure of which is herein incorporated by reference, that certain unsymmetrical anthracenes are extremely useful in OLED devices that exhibit high efficiencies. These compounds have been found to be particularly useful in blue light-emitting layers of OLED devices that produce white light. Blue light-emitting layer 50 includes a monoanthracene derivative of Formula (I) as a host material

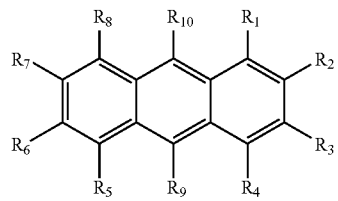

wherein:

$R_1$-$R_8$ are H; and $R_9$ is a naphthyl group containing no fused rings with aliphatic carbon ring members; provided that $R_9$ and $R_{10}$ are not the same, and are free of amines and sulfur compounds. Suitably, $R_9$ is a substituted naphthyl group with one or more further fused rings such that it forms a fused aromatic ring system, such as a phenanthryl, pyrenyl, fluoranthene, perylene, or substituted with one or more substituents such as fluorine, cyano group, hydroxy, alkyl, alkoxy, aryloxy, aryl, a heterocyclic oxy group, carboxy, trimethylsilyl group, or an unsubstituted naphthyl group of two fused rings. Conveniently, $R_9$ is 2-naphthyl, or 1-naphthyl substituted or unsubstituted in the para position; and $R_{10}$ is a biphenyl group having no fused rings with aliphatic carbon ring members. Suitably $R_{10}$ is a substituted biphenyl group, such that is forms a fused aromatic ring system including but not limited to a naphthyl, phenanthryl, perylene, or substituted with one or more substituents such as fluorine, cyano group, hydroxy, alkyl, alkoxy, aryloxy, aryl, a heterocyclic oxy group, carboxy, trimethylsilyl group, or an unsubstituted biphenyl group. Conveniently, $R_{10}$ is 4-biphenyl, 3-biphenyl unsubstituted or substituted with another phenyl ring without fused rings to form a terphenyl ring system, or 2-biphenyl.

Some examples of useful mono-anthracene materials for use in a light-emitting layer include:
Host-1
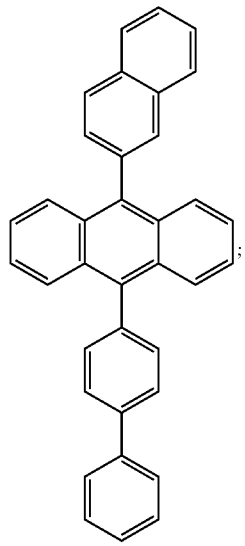
Host-2
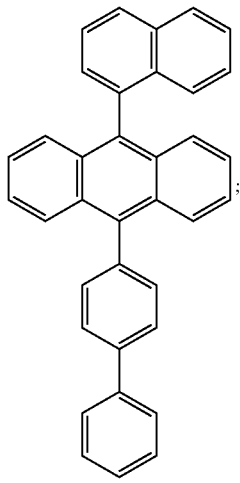
Host-3
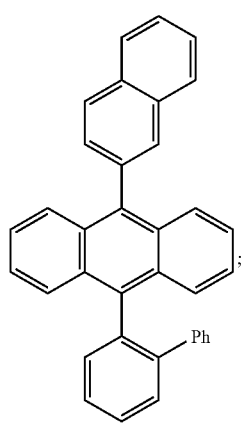
Host-4
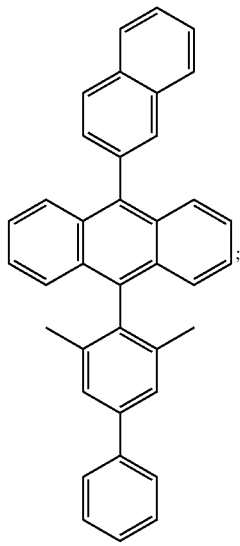
Host-5
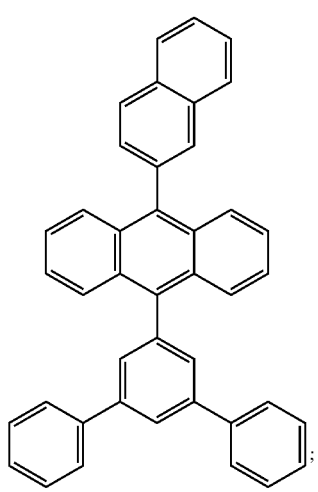
Host-6
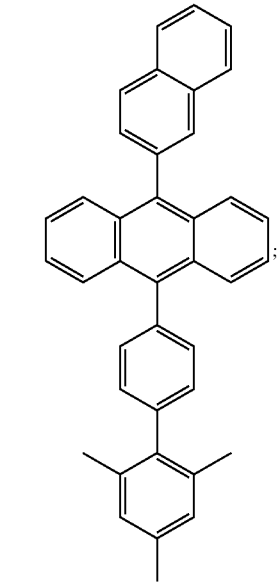

Host-7
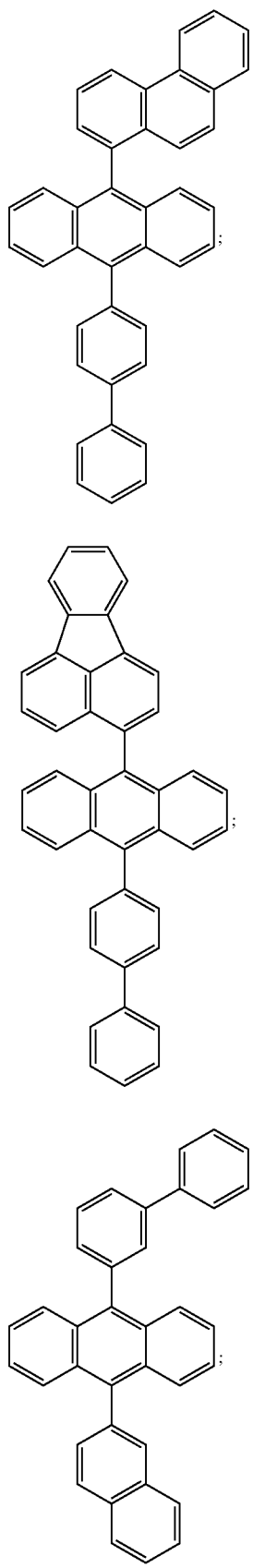
Host-8
Host-9
Host-10
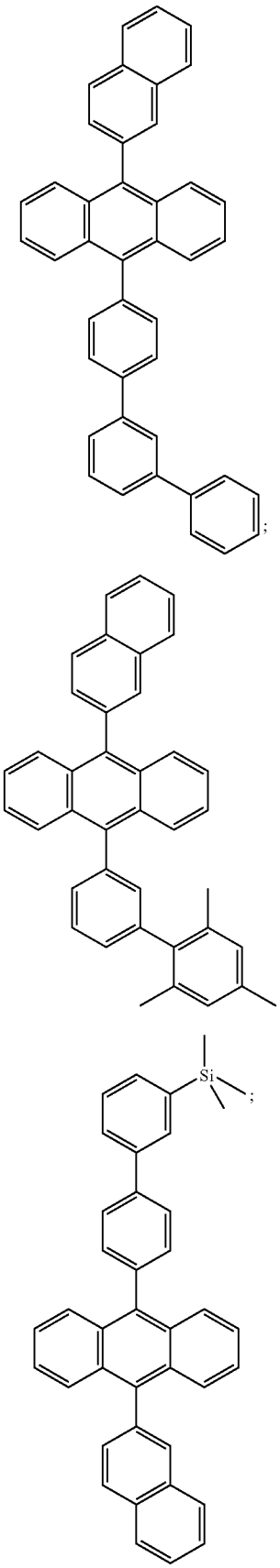
Host-11
Host-12

Host-13
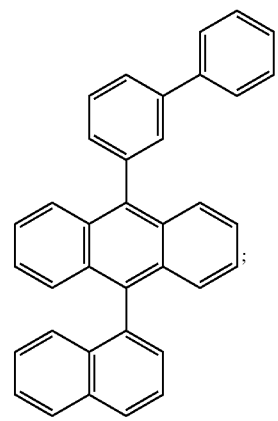
Host-14
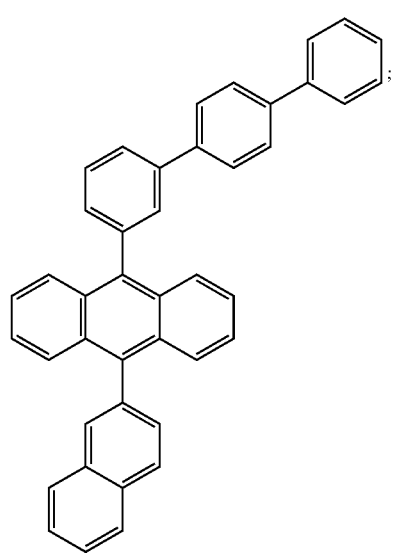
Host-15
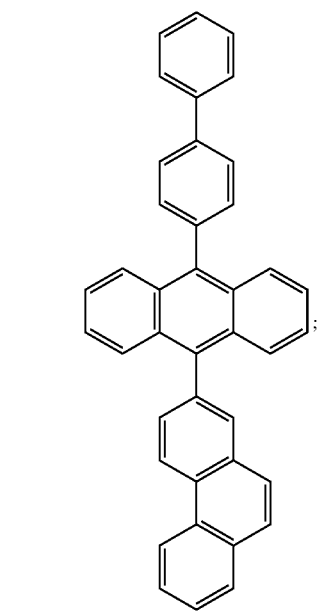
Host-16
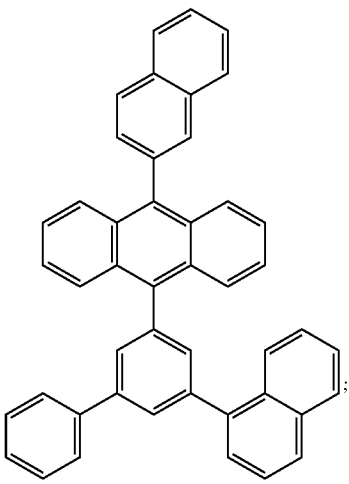
Host-17
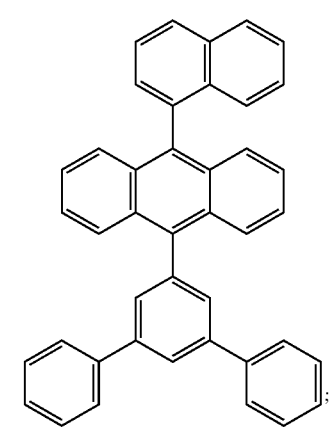
Host-18
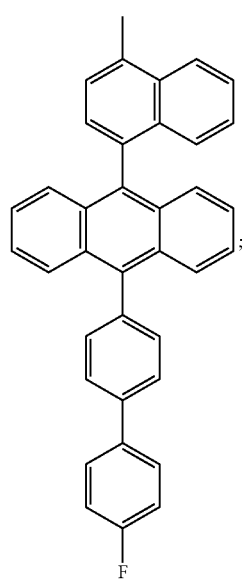

Host-19
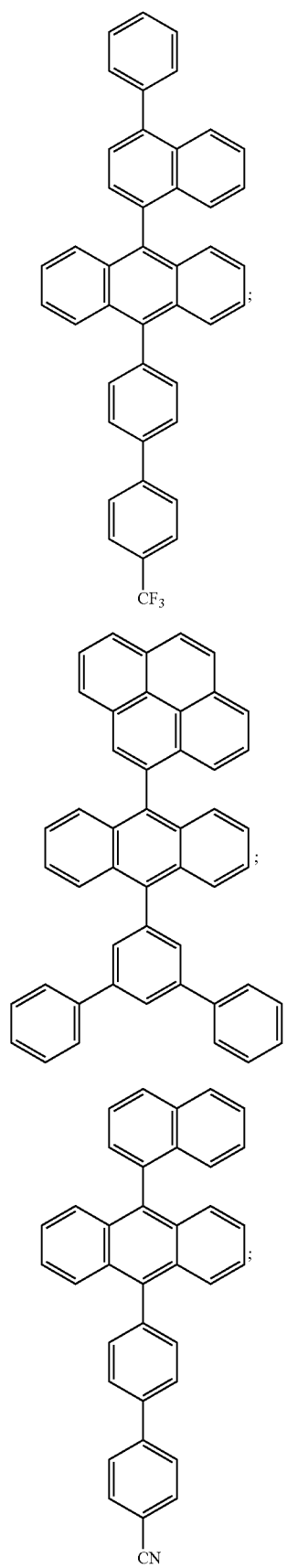
Host-20
Host-21
Host-22
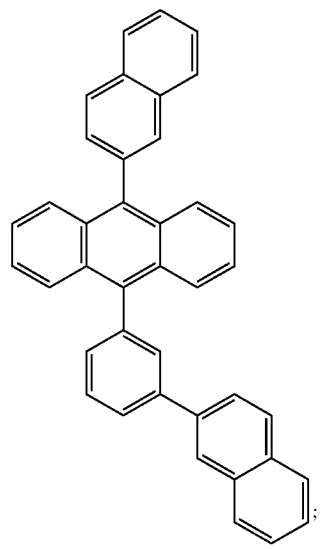
Host-23
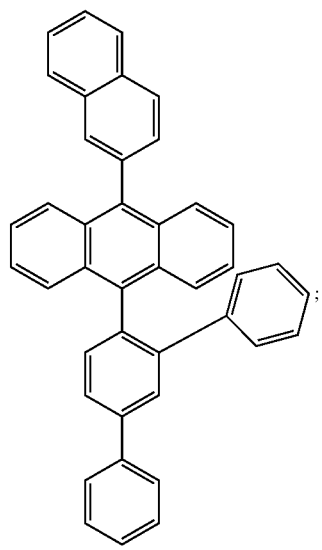
Host-24
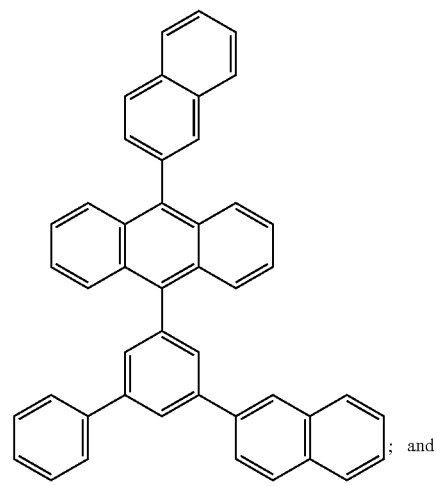
; and -continued

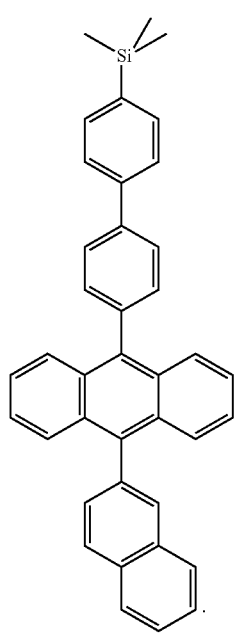
Host-25

Particularly useful is 9-(2-naphthyl)-10-(4-biphenyl)anthracene (Host-1).

The aromatic amine derivative can be any such amine that has hole-transporting properties. Hole-transporting layers and materials will be further described below. Some examples of aromatic amine derivatives that can be used in first light-emitting layer 45 include the following:

1,1-Bis(4-di-p-tolylaminophenyl)cyclohexane;
1,1-Bis(4-di-p-tolylaminophenyl)-4-phenylcyclohexane;
4,4'-Bis(diphenylamino)quaterphenyl;
Bis(4-dimethylamino-2-methylphenyl)-phenylmethane;
Tri(p-tolyl)amine;
4-(di-p-tolylamino)-4'-[4'-(di-p-tolylamino)-1-styryl]stilbene;
N,N,N',N'-Tetra-p-tolyl-4,4'-diaminobiphenyl;
N,N,N',N'-Tetraphenyl-4,4'-diaminobiphenyl;
N-Phenylcarbazole;
Poly(N-vinylcarbazole);
N,N'-di-1-naphthalenyl-N,N'-diphenyl-4,4'-diaminobiphenyl;
4,4'-Bis[N-(1-naphthyl)-N-phenylamino]biphenyl (NPB);
4,4'-Bis[N-(1-naphthyl)-N-(2-naphthyl)amino]biphenyl (TNB);
4,4"-Bis[N-(1-naphthyl)-N-phenylamino]-p-terphenyl;
4,4'-Bis[N-(2-naphthyl)-N-phenylamino]biphenyl;
4,4'-Bis[N-(3-acenaphthenyl)-N-phenylamino]biphenyl;
1,5-Bis[N-(1-naphthyl)-N-phenylamino]naphthalene;
4,4'-Bis[N-(9-anthryl)-N-phenylamino]biphenyl;
4,4"-Bis[N-(1-anthryl)-N-phenylamino]$_p$-terphenyl;
4,4'-Bis[N-(2-phenanthryl)-N-phenylamino]biphenyl;
4,4'-Bis[N-(8-fluoranthenyl)-N-phenylamino]biphenyl;
4,4'-Bis[N-(2-pyrenyl)-N-phenylamino]biphenyl;
4,4'-Bis[N-(2-naphthacenyl)-N-phenylamino]biphenyl;
4,4'-Bis[N-(2-perylenyl)-N-phenylamino]biphenyl;
4,4'-Bis[N-(1-coronenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;
N,N,N',N'-Tetra(2-naphthyl)-4,4"-diamino-p-terphenyl;
4,4'-Bis{N-phenyl-N-[4-(1-naphthyl)-phenyl]amino}biphenyl;
4,4'-Bis[N-phenyl-N-(2-pyrenyl)amino]biphenyl;
2,6-Bis[N,N-di(2-naphthyl)amino]fluorene; and
1,5-Bis[N-(1-naphthyl)-N-phenylamino]naphthalene.

Desirable fluorescent dopants include perylene or derivatives of perylene, derivatives of anthracene, tetracene, xanthene, Rubrene, coumarin, rhodamine, quinacridone, dicyanomethylenepyran compounds, thiopyran compounds, polymethine compounds, pyrylium and thiapyrylium compounds, derivatives of distryrylbenzene or distyrylbiphenyl, bis(azinyl)methane boron complex compounds, and carbostyryl compounds. Illustrative examples of useful dopants include, but are not limited to, the following:

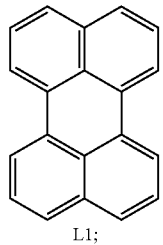
L1;

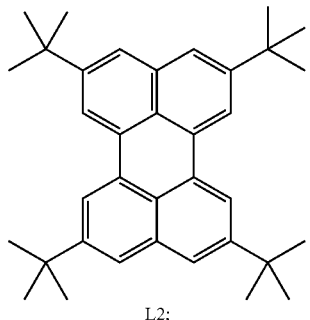
L2;

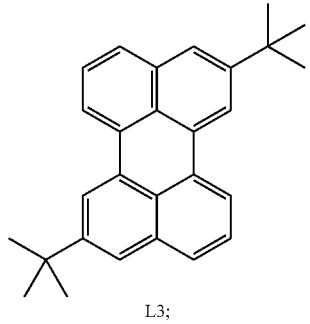
L3;

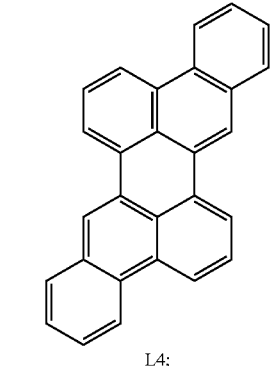
L4;

-continued

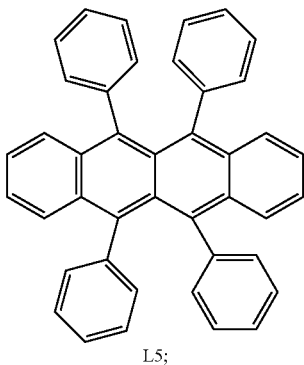
L5;

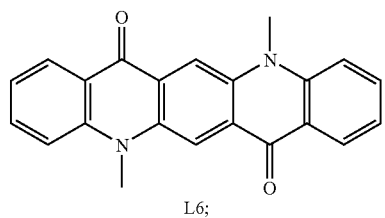
L6;

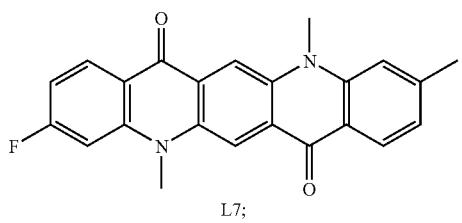
L7;

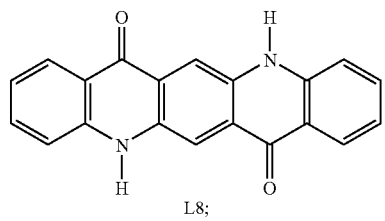
L8;

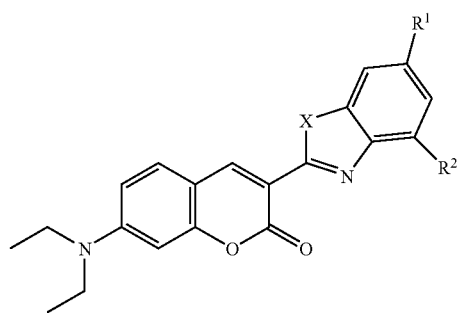

|  | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

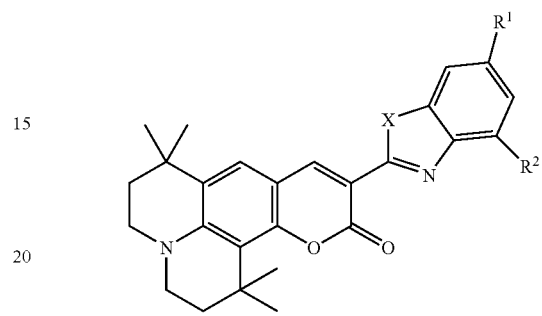

|  | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

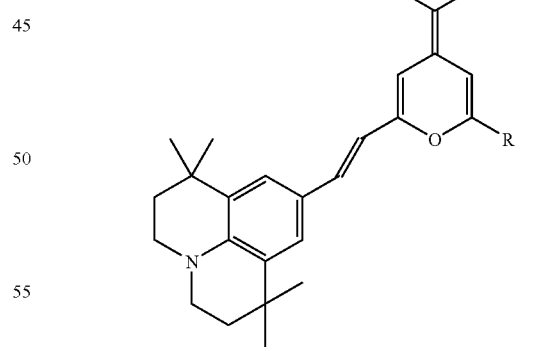

|  | R |
|---|---|
| L37 | Phenyl |
| L38 | Methyl |
| L39 | t-butyl |
| L40 | Mesityl |

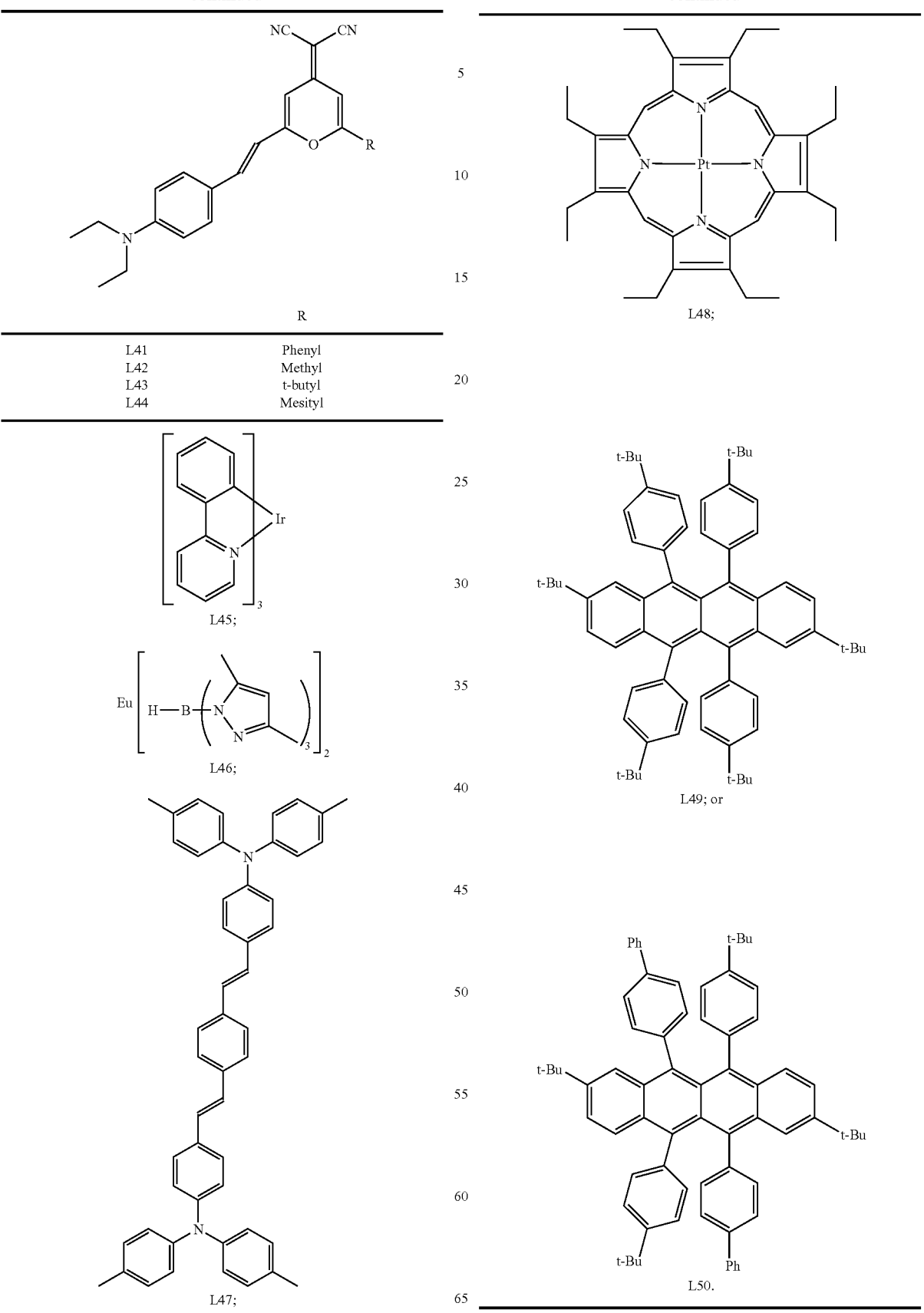

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. at. No. 6,194,119 B1 and references cited therein.

First light-emitting layer 45 includes a first light-emitting material. In a preferred embodiment, first light-emitting layer 45 can have a peak emission in the yellow to red portion of the visible spectrum, and therefore the first light-emitting material can be a light-emitting yellow, orange, or red dopant. A light-emitting yellow-orange dopant can include a compound of the following structures:

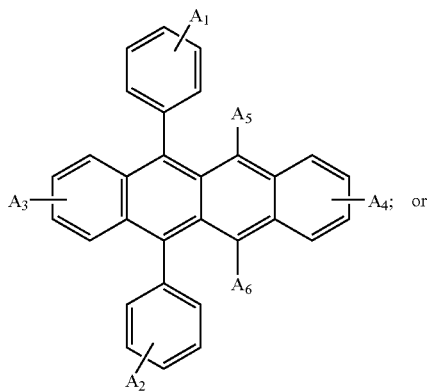

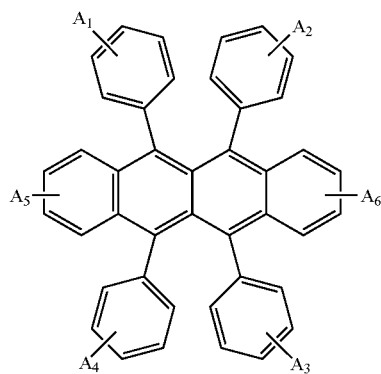

wherein $A_1$-$A_6$ represent one or more substituents on each ring and where each substituent is individually selected from one of the following:

Category 1: hydrogen, or alkyl of from 1 to 24 carbon atoms;

Category 2: aryl or substituted aryl of from 5 to 20 carbon atoms;

Category 3: hydrocarbon containing 4 to 24 carbon atoms, completing a fused aromatic ring or ring system;

Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;

Category 5: alkoxylamino, alkylamino, or arylamino of from 1 to 24 carbon atoms; or Category 6: fluoro, chloro, bromo or cyano.

Examples of particularly useful yellow-orange dopants include 5,6,11,12-tetraphenylnaphthacene (Rubrene); 6,11-diphenyl-5,12-bis(4-(6-methyl-benzothiazol-2-yl)phenyl) naphthacene (DBzR), 5,6,11,12-tetra(2-naphthyl)-naphthacene (NR), and Formulas L49 and L50, the formulas of which are shown below:

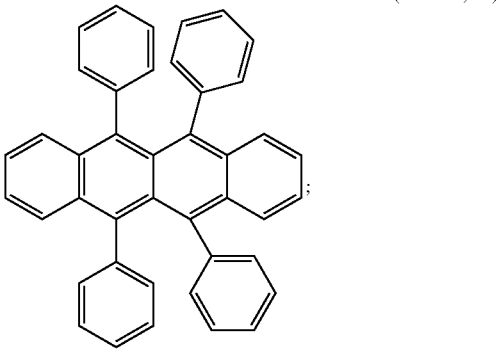
(Rubrene, P3)

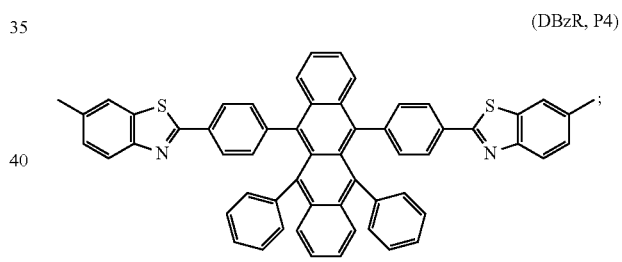
(DBzR, P4)

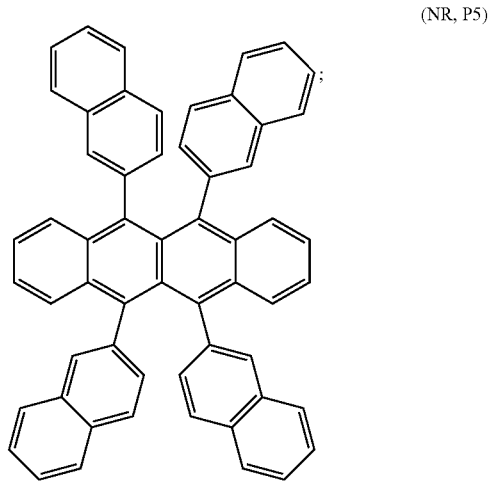
(NR, P5)

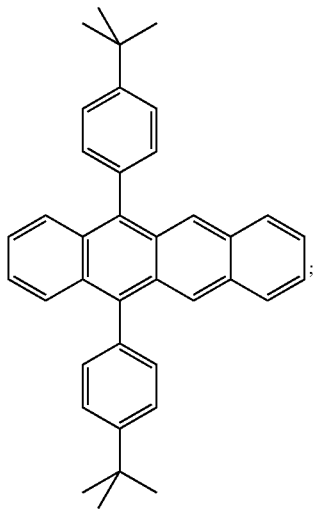

(tBuDPN, P6)

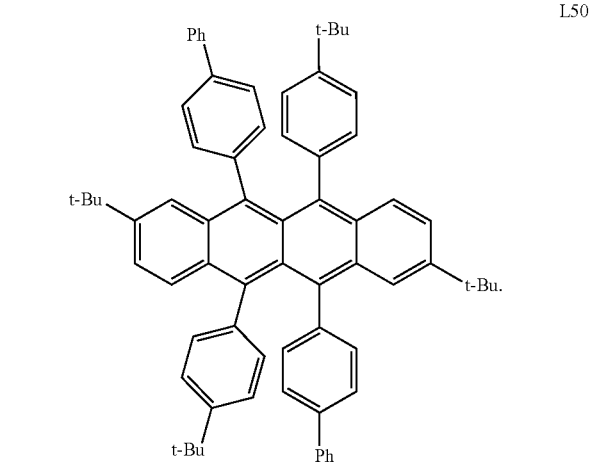

L50

A suitable yellow dopant can also be a mixture of compounds that would also be yellow dopants individually.

A suitable light-emitting red-orange dopant can include a diindenoperylene compound of the following structure Q1:

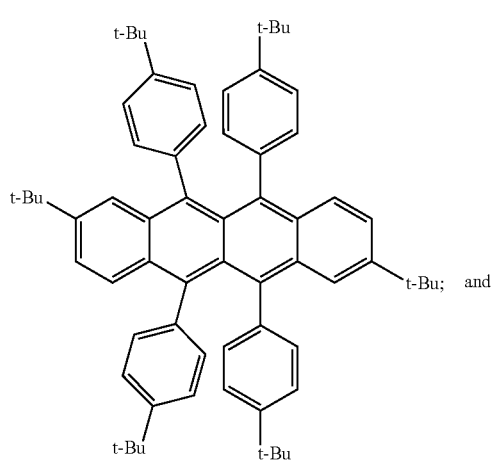

L49

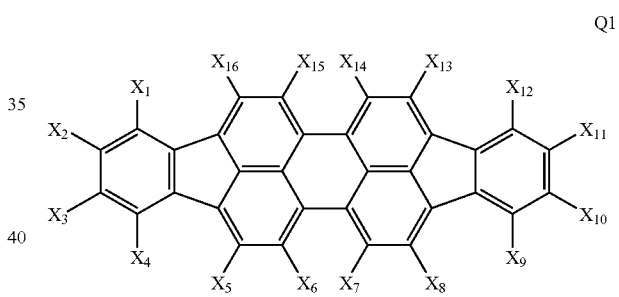

Q1 wherein $X_1$-$X_{16}$ are independently selected as hydro or substituents that provide red luminescence.

Illustrative examples of useful red-orange dopants of this class include the following:

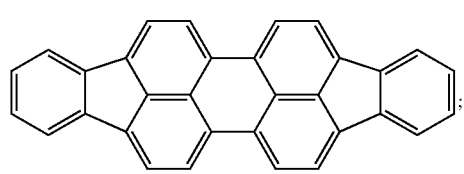

Q2

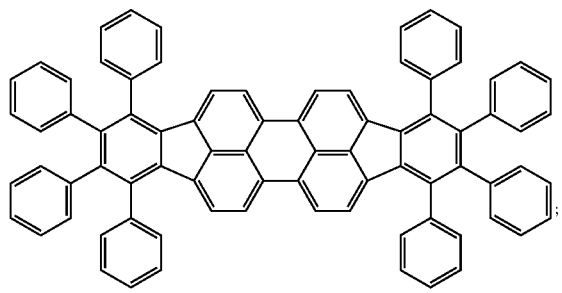

Q3

Q4
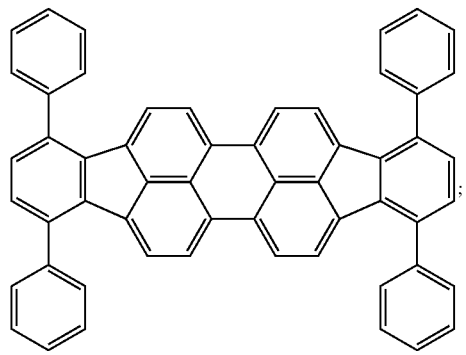
Q5
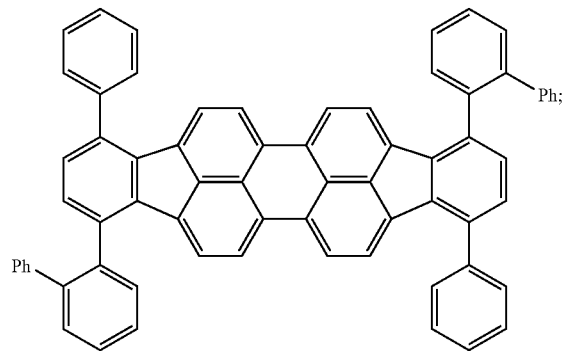
Q6
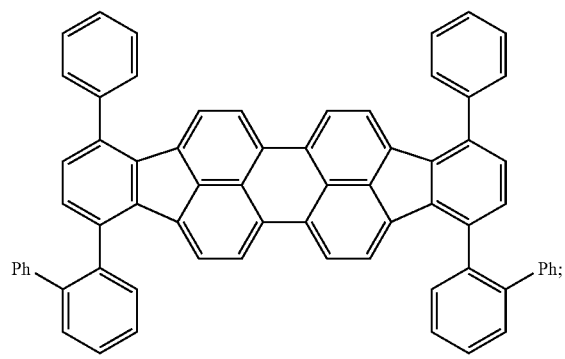
Q7
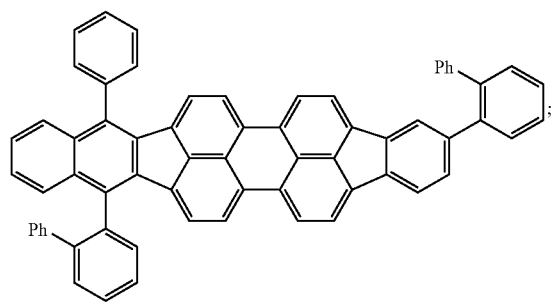
Q8
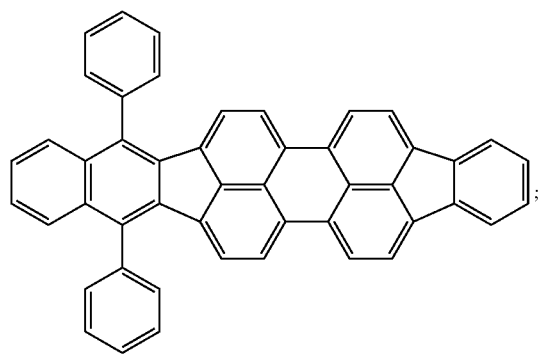
Q9
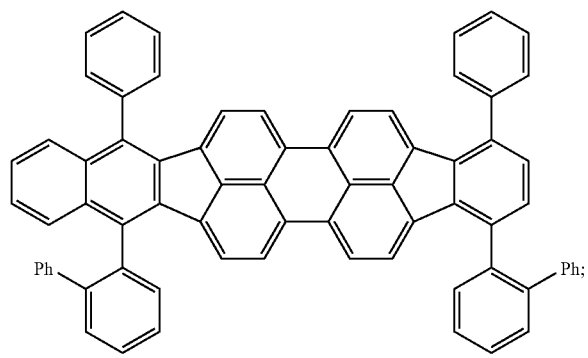
Q10
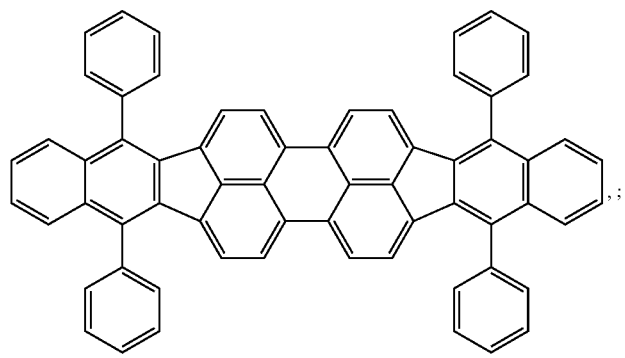
TPDBP -continued
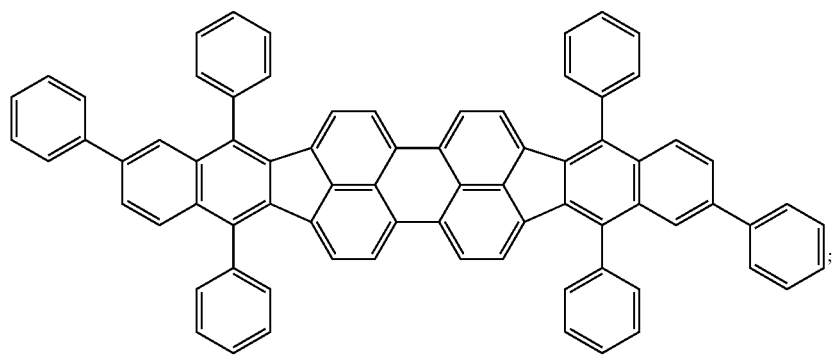
Q11
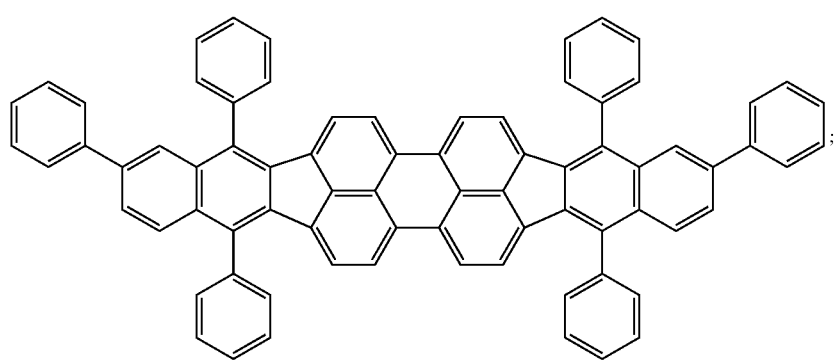
Q12
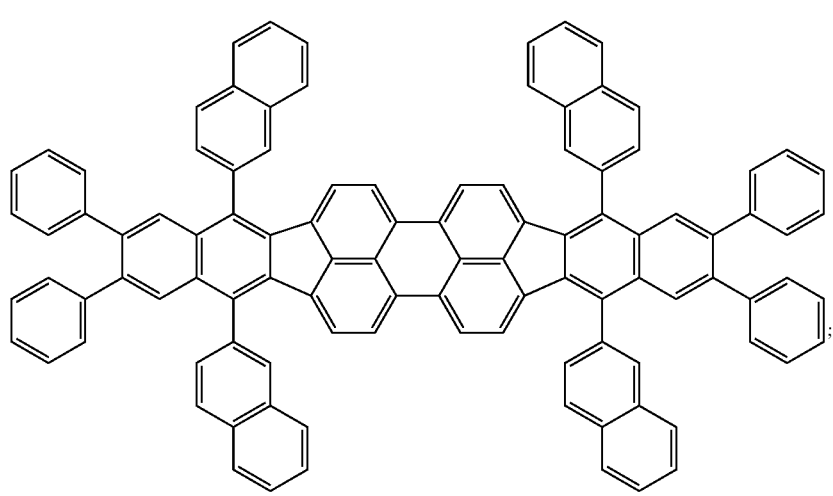
Q13
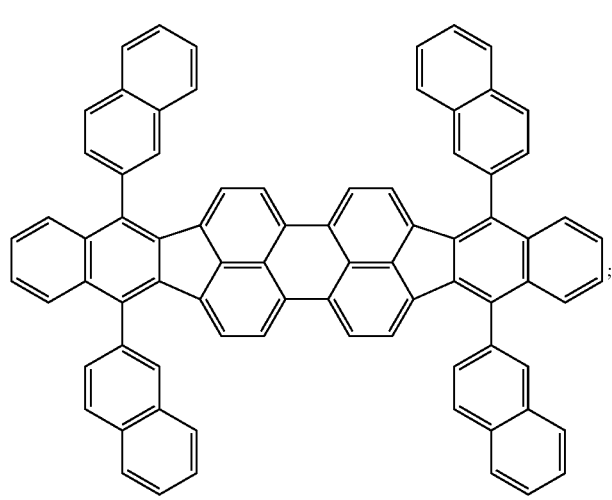
Q14

-continued
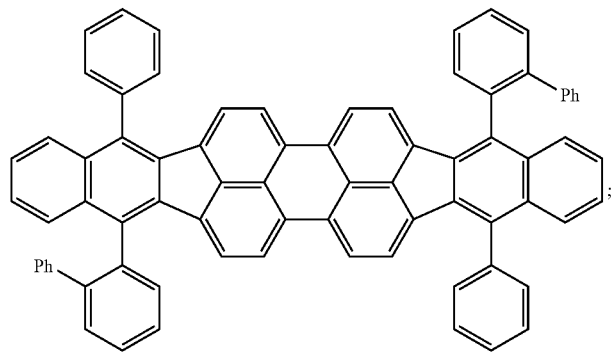
Q15
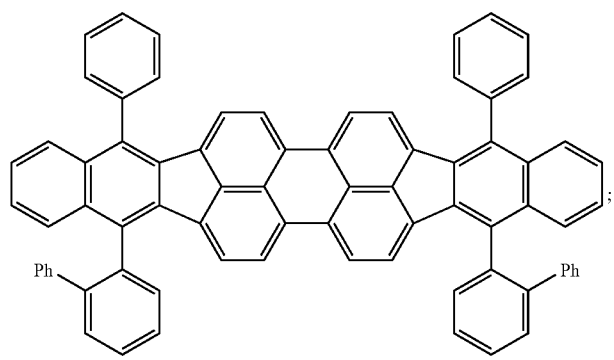
Q16
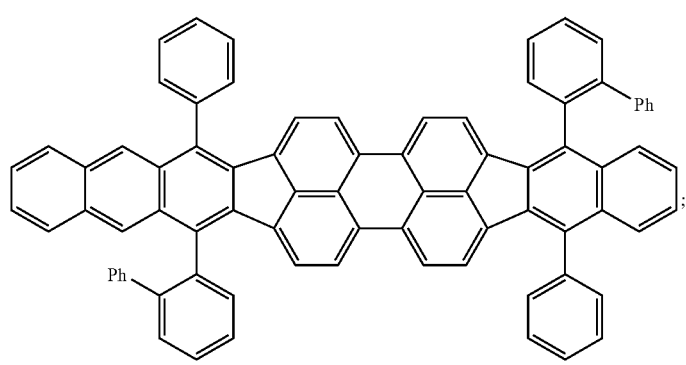
Q17
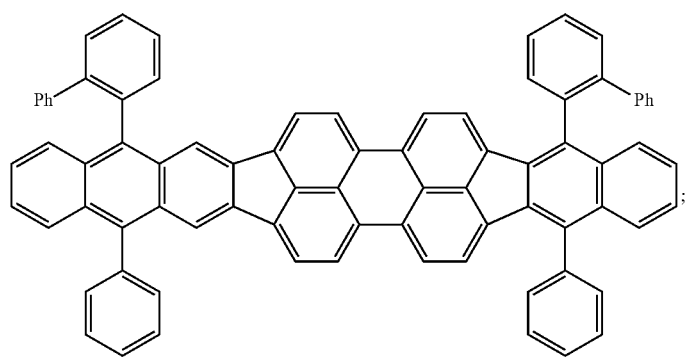
Q18

-continued
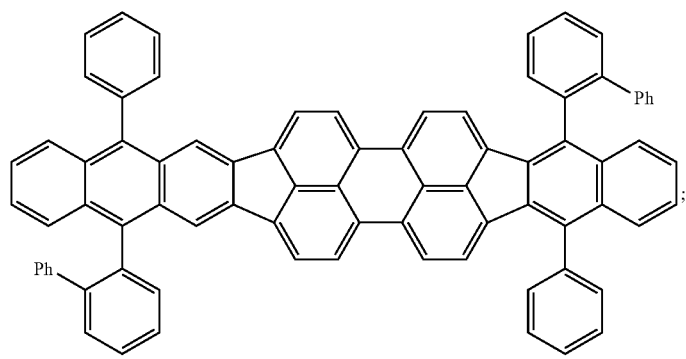
Q19
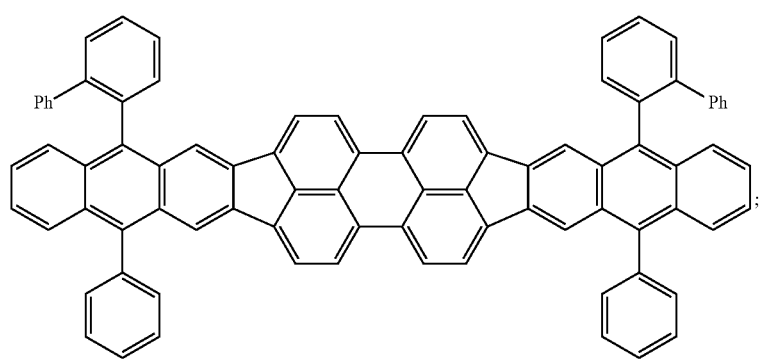
Q20
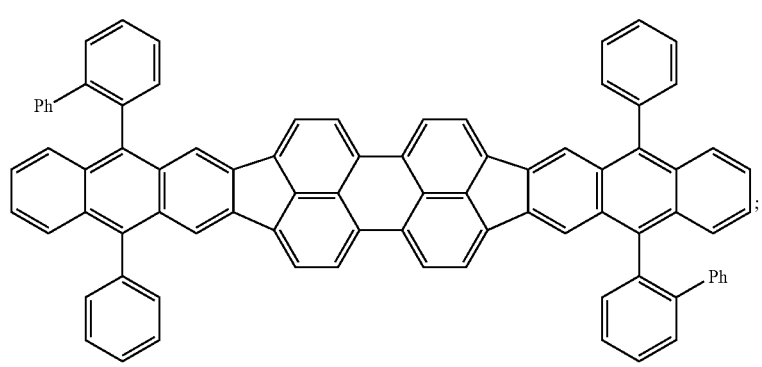
Q21
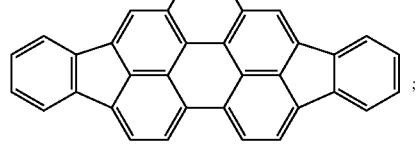
Q22
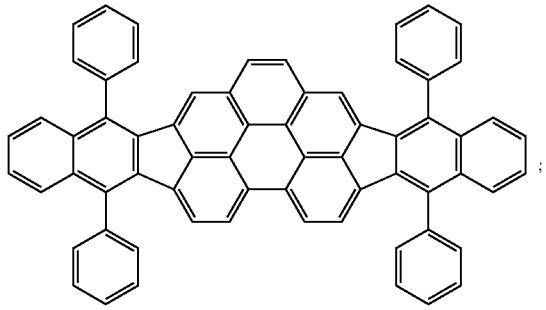
Q23

Q24
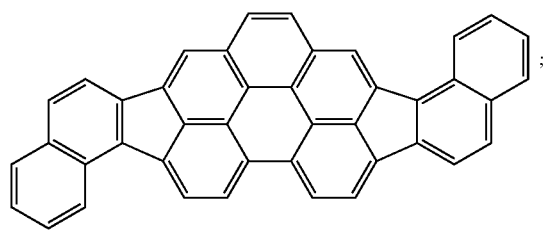

Q25
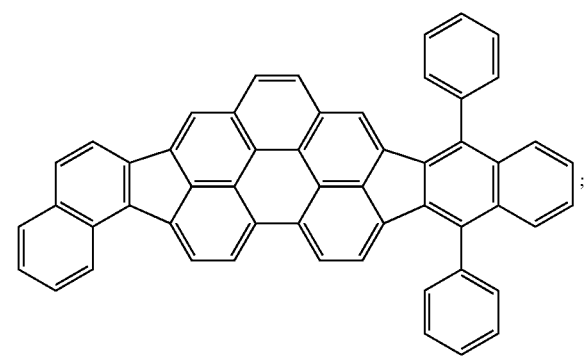

Q26
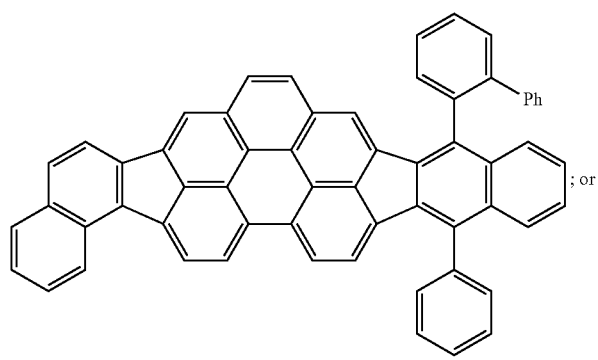

Q27
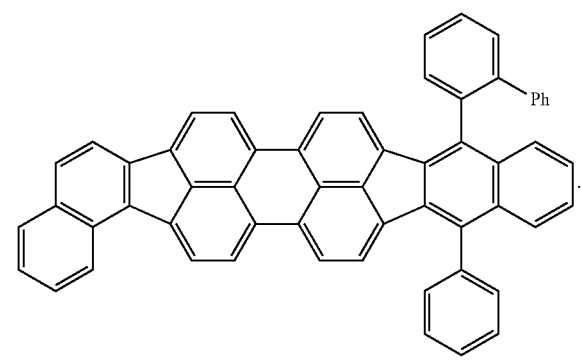

A particularly preferred diindenoperylene dopant is dibenzo{[f,f']-4,4'7,7'-tetraphenyl]diindeno-[1,2,3-cd:1',2',3'-lm]perylene (TPDBP, Q10 above).

Other red-orange dopants useful in the present invention belong to the DCM class of dyes represented by:

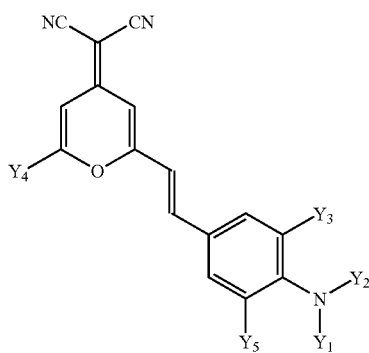

wherein:

$Y_1$-$Y_5$ represent one or more groups independently selected from hydro, alkyl, substituted alkyl, aryl, or substituted aryl; and $Y_1$-$Y_5$ independently include acyclic groups or are joined pairwise to form one or more fused rings, provided that $Y_3$ and $Y_5$ do not together form a fused ring.

In a useful and convenient embodiment that provides red-orange luminescence, $Y_1$-$Y_5$ are selected independently from hydro, alkyl and aryl. Structures of particularly useful dopants of the DCM class are shown below:

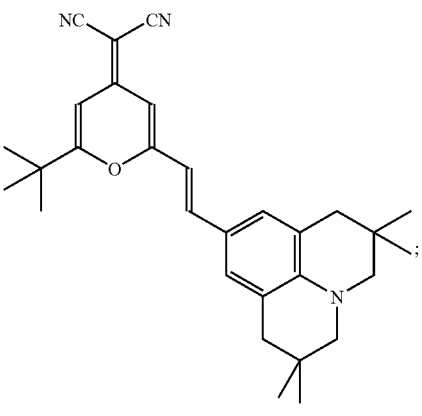

DCJTB

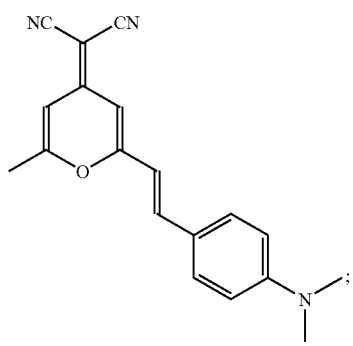

-continued

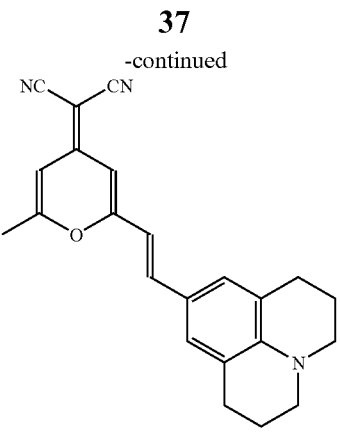

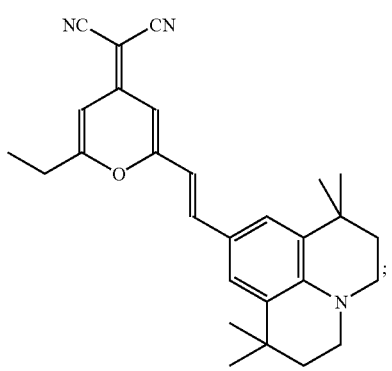

L37

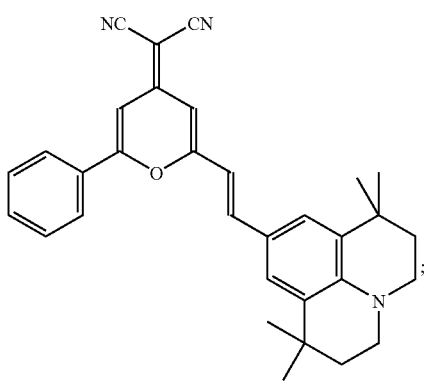

L38

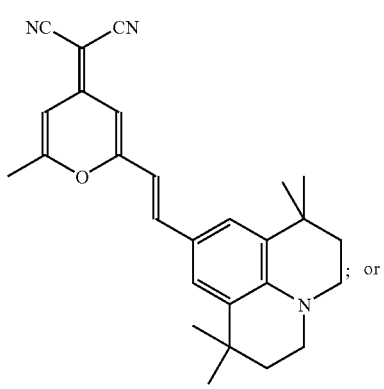
; or

-continued

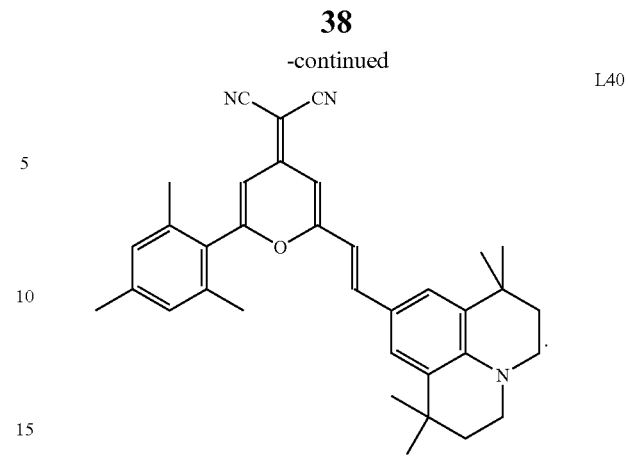
L40

A preferred DCM dopant is DCJTB. A useful red-orange dopant can also be a mixture of compounds that would also be red-orange dopants individually.

Second light-emitting layer 50 is provided over or under first light-emitting layer 45. Second light-emitting layer 50 can have a peak emission in the blue to cyan portion of the spectrum, so that white light is produced by the combined emission of the two light-emitting layers when the first light-emitting layer has a peak emission in the yellow to red portion of the spectrum. Second light-emitting layer 50 includes a second host material and a second light-emitting material. In one embodiment, the second host material is one or more mono-anthracene derivatives, wherein the mono-anthracene derivatives are selected from the same potential mono-anthracene derivatives as for first light-emitting layer 45. The mono-anthracene derivative(s) selected for second light-emitting layer 50 can be the same as or different from those selected for first light-emitting layer 45.

In another embodiment, the second host material can include a mixture of one or more mono-anthracene derivatives provided in a volume fraction range of greater than 85% to less than 100% relative to the total host volume, and one or more aromatic amine derivatives provided in a volume fraction range of greater than 0% to less than 15% relative to the total host volume. The mono-anthracene derivatives are selected from the same mono-anthracene derivative candidates, and the aromatic amine derivatives from the same aromatic amine derivative candidates, as for first light-emitting layer 45. The mono-anthracene derivative(s) selected for second light-emitting layer 50 can be the same as or different from those selected for first light-emitting layer 45. Likewise, the aromatic amine derivative(s) selected for second light-emitting layer 50 can be the same as or different from those selected for first light-emitting layer 45.

The second light-emitting material can be a light-emitting blue dopant and can include perylene or derivatives thereof, blue-emitting derivatives of distyrylbenzene or a distyrylbiphenyl that have one or more aryl amine substituents, or a compound of the structure:

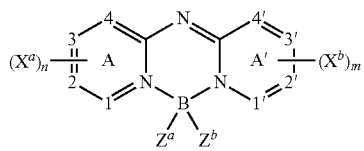

wherein:

A and A' represent independent azine ring systems corresponding to 6-membered aromatic ring systems containing at least one nitrogen;

$(X^a)_n$, and $(X^b)_m$ represent one or more independently selected substituents and include acyclic substituents or are joined to form a ring fused to A or A';

m and n are independently 0 to 4;

$Z^a$ and $Z^b$ are independently selected substituents;

1, 2, 3, 4, 1', 2', 3', and 4' are independently selected as either carbon or nitrogen atoms; and provided that $X^a$, $X^b$, $Z^a$, and $Z^b$, 1, 2, 3, 4, 1', 2', 3', and 4' are selected to provide blue luminescence.

Some examples of the above class of dopants include the following:

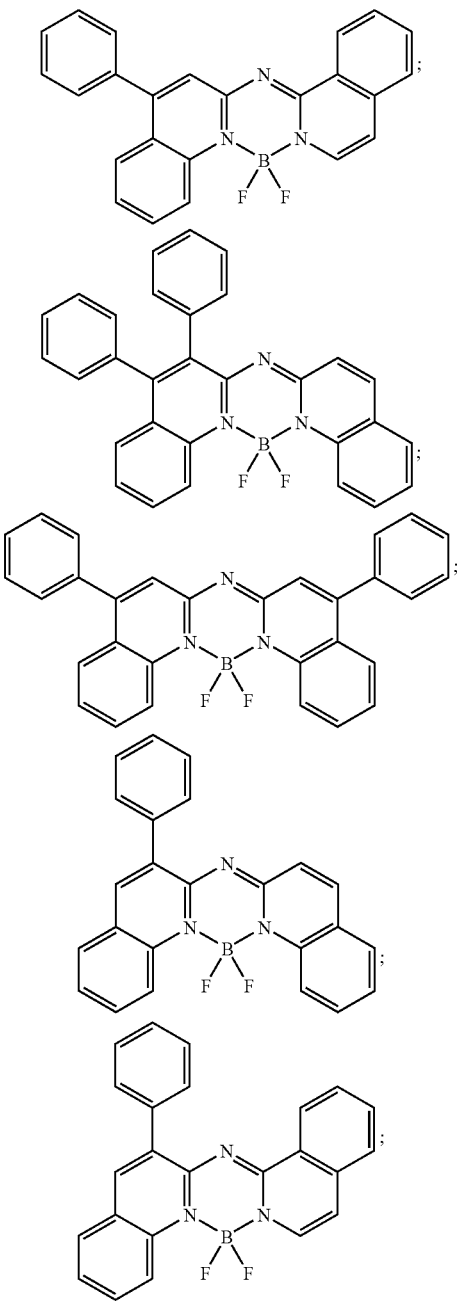

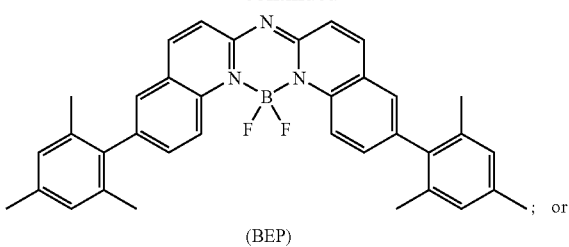

(BEP)

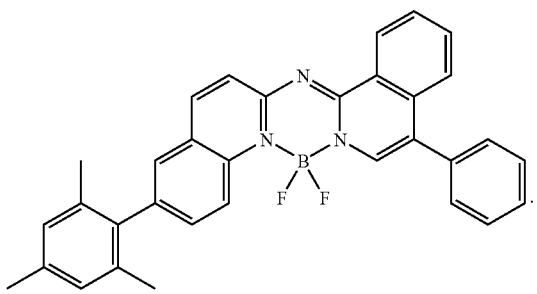

Another particularly useful class of blue dopants includes blue-emitting derivatives of such distyrylarenes as distyrylbenzene and distyrylbiphenyl, including compounds described in U.S. Pat. No. 5,121,029. Among derivatives of distyrylarenes that provide blue luminescence, particularly useful are those substituted with diarylamino groups, also known as distyrylamines. Examples include bis[2-[4-[N,N-diarylamino]phenyl]vinyl]-benzenes of the general structure N1 shown below:

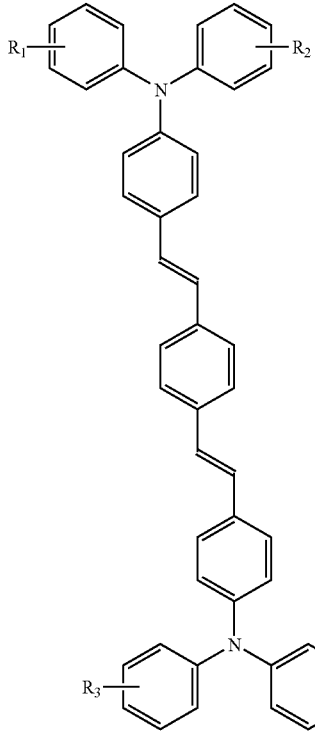

and bis[2-[4-[N,N-diarylamino]phenyl]vinyl]biphenyls of the general structure N2 shown below:

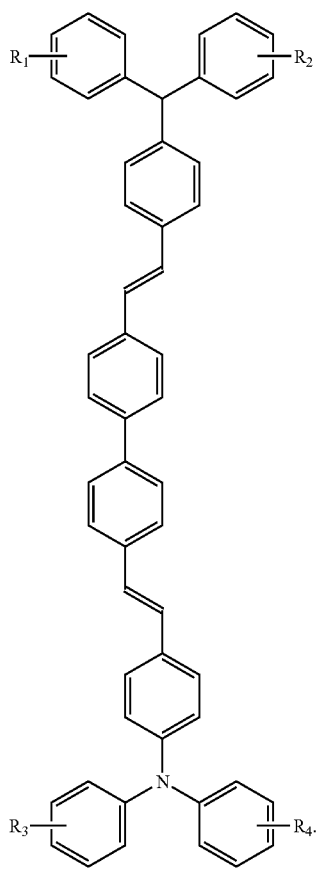

N2

In Formulas N1 and N2, $R_1$-$R_4$ can be the same or different, and individually represent one or more substituents such as alkyl, aryl, fused aryl, halo, or cyano. In a preferred embodiment, $R_1$-$R_4$ are individually alkyl groups, each containing from one to about ten carbon atoms. A particularly preferred blue dopant of this class is 1,4-bis[2-[4-[N,N-di(p-tolyl) amino]phenyl]vinyl]benzene (BDTAPVB, Formula L47 above).

The color filter 25 includes color filter elements for the color to be emitted from the pixel of OLED device 10 and is part of a color filter array that is combined with organic EL element 70. Color filter 25 is constructed to pass a pre-selected color of light in response to white light, so as to produce a pre-selected color output. An array of three different kinds of color filters 25 that pass red, green, and blue light, respectively, is particularly useful in a full color OLED device. Several types of color filters are known in the art. One type of color filter 25 is formed on a second transparent substrate and then aligned with the pixels of the first substrate 20. An alternative type of color filter 25 is formed directly over the elements of the pixel of OLED device 10. In a display comprising multiple pixels, the space between the individual color filter elements can also be filled with a black matrix (not shown) to reduce pixel cross talk and improve the display's contrast. While color filter 25 is shown here as being located between anode 30 and substrate 20, it can alternatively be located on the outside surface of substrate 20. For a top-emitting device, color filter 25 can be located over cathode 90.

Alternatively, the color filters can be replaced with color change media (CCM). Color change media absorb light of one wavelength and emit light of a longer wavelength by fluorescence. Commonly, a CCM layer absorbs blue or green light and emits green or red. CCM layers can be used in conjunction with color filters.

While not always necessary, it is often useful that a hole-injecting layer 35 be formed over anode 30 in an organic light-emitting display. The hole-injecting material can serve to improve the film formation property of subsequent organic layers and to facilitate injection of holes into the hole-transporting layer. Suitable materials for use in hole-injecting layer 35 include, but are not limited to, porphyrinic compounds as described in U.S. Pat. No. 4,720,432, plasma-deposited fluorocarbon polymers as described in U.S. Pat. No. 6,208,075, and inorganic oxides including vanadium oxide ($VO_x$), molybdenum oxide ($MoO_x$), and nickel oxide ($NiO_x$). Alternative hole-injecting materials reportedly useful in organic EL devices are described in EP 0 891 121 A1 and EP 1 029 909 A1.

While not always necessary, it is often useful that a hole-transporting layer 40 be formed and disposed over anode 30. Desired hole-transporting materials can be deposited by any suitable way such as evaporation, sputtering, chemical vapor deposition, electrochemical means, thermal transfer, or laser thermal transfer from a donor material. Hole-transporting materials useful in hole-transporting layer 40 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines is those which include at least two aromatic tertiary amine moieties as described in U.S. Pat. Nos. 4,720,432 and 5,061,569. Such compounds include those represented by structural Formula A

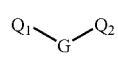

A wherein:

$Q_1$ and $Q_2$ are independently selected aromatic tertiary amine moieties; and G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene moiety. When G is an aryl group, it is conveniently a phenylene, biphenylene, or naphthalene moiety.

A useful class of triarylamines satisfying structural Formula A and containing two triarylamine moieties is represented by structural Formula B

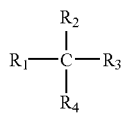

where:

R$_1$ and R$_2$ each independently represent a hydrogen atom, an aryl group, or an alkyl group or R$_1$ and R$_2$ together represent the atoms completing a cycloalkyl group; and R$_3$ and R$_4$ each independently represent an aryl group, which is in turn substituted with a diaryl substituted amino group, as indicated by structural Formula C

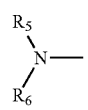

wherein R$_5$ and R$_6$ are independently selected aryl groups. In one embodiment, at least one of R$_5$ or R$_6$ contains a polycyclic fused ring structure, e.g., a naphthalene.

Another class of aromatic tertiary amines is the tetraaryldiamines. Desirable tetraaryldiamines include two diarylamino groups, such as indicated by Formula C, linked through an arylene group. Useful tetraaryldiamines include those represented by Formula D

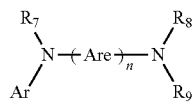

wherein:

each Are is an independently selected arylene group, such as a phenylene or anthracene moiety;

n is an integer of from 1 to 4; and

Ar, R$_7$, R$_8$, and R$_9$ are independently selected aryl groups.

In a typical embodiment, at least one of Ar, R$_7$, R$_8$, and R$_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halides such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are typically phenyl and phenylene moieties.

The hole-transporting layer in an OLED device can be formed of a single or a mixture of aromatic tertiary amine compound(s). Specifically, one can employ a triarylamine, such as a triarylamine satisfying the Formula B, in combination with a tetraaryldiamine, such as indicated by Formula D. Useful aromatic tertiary amines include those listed as being useful in first light-emitting layer 45 above.

Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

While not always necessary, it is often useful that OLED device 10 includes an organic layer disposed over light-emitting layers 45 and 50, wherein the organic layer includes an electron-transporting material, e.g. electron-transporting layer 55. Desired electron-transporting materials can be deposited by any suitable way such as evaporation, sputtering, chemical vapor deposition, electrochemical means, thermal transfer, or laser thermal transfer from a donor material. Preferred electron-transporting materials for use in electron-transporting layer 55 are metal chelated oxinoid compounds, including chelates of oxine itself (also commonly referred to as 8-quinolinol or 8-hydroxyquinoline). Such compounds help to inject and transport electrons and both exhibit high levels of performance and are readily fabricated in the form of thin films. Exemplary of contemplated oxinoid compounds are those satisfying structural Formula E

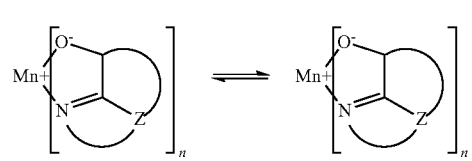

wherein:

M represents a metal;

n is an integer of from 1 to 3; and

Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as beryllium, magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is typically maintained at 18 or less.

Illustrative of useful chelated oxinoid compounds are the following:

CO-1: Aluminum trisoxine[alias, tris(8-quinolinolato)aluminum(III)];

CO-2: Magnesium bisoxine[alias, bis(8-quinolinolato)magnesium(II)];

CO-3: Bis[benzo{f}-8-quinolinolato]zinc (II);

CO-4: Bis(2-methyl-8-quinolinolato)aluminum(III)-β-oxo-bis(2-methyl-8-quinolinolato) aluminum(III);

CO-5: Indium trisoxine[alias, tris(8-quinolinolato)indium];

CO-6: Aluminum tris(5-methyloxine) [alias, tris(5-methyl-8-quinolinolato) aluminum(III)];

CO-7: Lithium oxine[alias, (8-quinolinolato)lithium(I)];

CO-8: Gallium oxine[alias, tris(8-quinolinolato)gallium (III)]; and

CO-9: Zirconium oxine[alias, tetra(8-quinolinolato)zirconium(IV)].

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula G are also useful electron-transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1-4, H. S. Nalwa, ed., John Wiley and Sons, Chichester (1997).

In some embodiments of this invention, it is useful to add a mono-anthracene derivative to electron-transporting layer 55, wherein the mono-anthracene derivative is present in an amount up to 50% by volume. The mono-anthracene derivative is selected from the same mono-anthracene derivative candidates as for first and second light-emitting layers 45 and 50. The mono-anthracene derivative selected for electron-transporting layer 55 can be the same as or different from those selected for the light-emitting layers.

It will be understood that, as is common in the art, some of the layers can have more than one function. Light-emitting layers 45 and 50 can have hole-transporting properties or electron-transporting properties as desired for performance of the OLED device. Hole-transporting layer 40 or electron-transporting layer 55, or both, can also have emitting properties. In such a case, fewer layers than described above can be sufficient for the desired emissive properties, or additional useful emissive properties can be obtained with the use of additional emissive layers. For example, electron-transporting layer 55 can include a light-emitting material, thereby providing a third light-emitting layer. This third light-emitting layer can have a peak emission in the yellow to green portion of the spectrum. Such a device can provide white light with a red first light-emitting layer 45, a blue second light-emitting layer 50, and a green light-emitting electron-transporting layer 55. Such a light-emitting electron-transporting layer can also include a mono-anthracene derivative as described above for additional stabilizing effects.

The organic EL media materials mentioned above are suitably deposited through a vapor-phase method including evaporation, sublimation, sputtering, chemical vapor deposition, and thermal transfer from a donor element. Organic EL media materials can alternatively be deposited from a fluid, for example, from a solvent with an optional binder to improve film formation. Deposition from a fluid can be done in many ways including, but not limited to ink-jet, spin coating, curtain coating, spray coating, and electrochemical deposition. If the material is a polymer, solvent deposition is typically preferred, but other methods can be used, including sputtering, electrochemical deposition, electrophoretic deposition or thermal transfer from a donor sheet. The material to be deposited by evaporation or sublimation can be vaporized from a sublimation "boat" often comprised of a tantalum material, e.g., as described in U.S. Pat. No. 6,237,529, or can be first coated onto a donor sheet and then sublimed in closer proximity to the substrate. Layers with a mixture of materials can use separate sublimation boats or the materials can be premixed and coated from a single boat or donor sheet.

An electron-injecting layer 60 can also be present between the cathode and the electron-transporting layer. Examples of electron-injecting materials include alkali or alkaline earth metals, alkali halide salts, such as LiF mentioned above, or alkali or alkaline earth metal doped organic layers.

In another embodiment of the present invention, the OLED device has a microcavity structure. In this case, both the anode and the cathode are metallic. One is essentially opaque and reflective; the other one is reflective and semitransparent. The reflective electrode is preferably selected from Au, Ag, Mg, Ca, or alloys thereof. Because of the presence of the two reflecting metal electrodes, the device has a microcavity structure. The strong optical interference in this structure results in a resonance condition. Emission near the resonance wavelength is enhanced and emission away from the resonance wavelength is depressed. The optical path length can be tuned by selecting the thickness of the organic layers or by placing a transparent optical spacer between the electrodes. For example, an OLED device of this invention can have an ITO spacer layer placed between a reflective anode and the organic EL media, with a semitransparent cathode over the organic EL media.

There are numerous configurations of the organic EL media layers wherein the present invention can be successfully practiced. Examples of organic EL media layers that produce white light are described, for example, in EP 1 187 235, EP 1 182 244, U.S. Patent Application Publication 2002/0025419, U.S. Pat. Nos. 5,683,823, 5,503,910, 5,405,709, and 5,283,182. As shown in EP 1 187 235, a white light-emitting organic EL element with a substantially continuous spectrum in the visible region of the spectrum can be achieved by providing at least two different dopants for collectively emitting white light, e.g. by the inclusion of the following layers:

a hole-injecting layer disposed over the anode;

a hole-transporting layer that is disposed over the hole-injecting layer and is doped with a light-emitting yellow dopant for emitting light in the yellow region of the spectrum;

a blue light-emitting layer including a host material and a light-emitting blue dopant disposed over the hole-transporting layer; and an electron-transporting layer.

EXAMPLES

The invention and its advantages can be better appreciated by the following inventive and comparative examples. In the following, mixed compositions are described in terms of percentages or ratios by volume, as are commonly used in the art.

Examples 1 to 8

Examples 1 to 8 were prepared using a red-orange emitting layer using NPB host with Rubrene co-host and a red-orange dopant of Formula Q23. The blue-green emitting layer includes 9-(1-naphthyl)-10-(biphenyl-4-yl)anthracene (TBADN) host (as host) with 2.5% 4-(di-p-tolylamino)-4'-[(di-p-tolylamino)styryl]stilbene (Formula N1) (as dopant) and 6.4% NPB as co-dopant.

Example 1

A comparative OLED device was constructed in the following manner:

1. A clean glass substrate was vacuum-deposited with indium tin oxide (ITO) to form a transparent electrode of 85 nm thickness;

2. The above-prepared ITO surface was treated with a plasma oxygen etch, followed by plasma deposition of a 0.5 nm layer of a fluorocarbon polymer (CFx) as described in U.S. Pat. No. 6,208,075;

3. The above-prepared substrate was further treated by vacuum-depositing a 240 nm layer of 4,4'-bis[N-(1-naphthyl)-N-phenylamino]biphenyl (NPB) as a hole-transporting layer (HTL);

4. A 28 nm layer of NPB (as host) with 28% Rubrene and 0.4% red-orange emitting dopant as shown in Formula Q23 were deposited on to the HTL layer to form a red-orange emitting first light-emitting layer;

5. A coating of 47 nm of 9-(1-naphthyl)-10-(biphenyl-4-yl)anthracene (TBADN) host with 2.5% 4-(di-p-tolylamino)-4'-[(di-p-tolylamino)styryl]stilbene (Formula N1) (as dopant) and 6.4% NPB co-dopant were co-evaporatively deposited on the above substrate to form a blue-green emitting second light-emitting layer;

6. A 10 nm layer of tris(8-quinolinolato)aluminum (III) (ALQ) was vacuum-deposited onto the substrate at a coating station that included a heated graphite boat source to form an electron-transporting layer;

7. A 100 nm cathode layer was deposited onto the electron-transporting layer. The cathode includes 0.5 nm of LiF as an electron injection layer followed by 100 nm of aluminum, to form a cathode layer; and 8. The device was then transferred to a dry box for encapsulation.

Examples 2-8 are similar to Example 1 except that the NPB doping % in the blue-green emitting layer is varied.

Table 1 shows the device performance of Examples 1 to 8. It shows the device structure, luminance efficiency, chromaticity (CIEx and CIEy) and drive voltage. Also it gives the predicted average power consumption (mW) for RGB and RGBW displays at the panel luminance level of 180 cd/m2, given a typical set of digital pictorial images. The power consumption calculation assumes a display size of 2.16" diagonal, a circular polarizer with 44% transmittance, and a typical set of LCD color filters.

Figure 2:
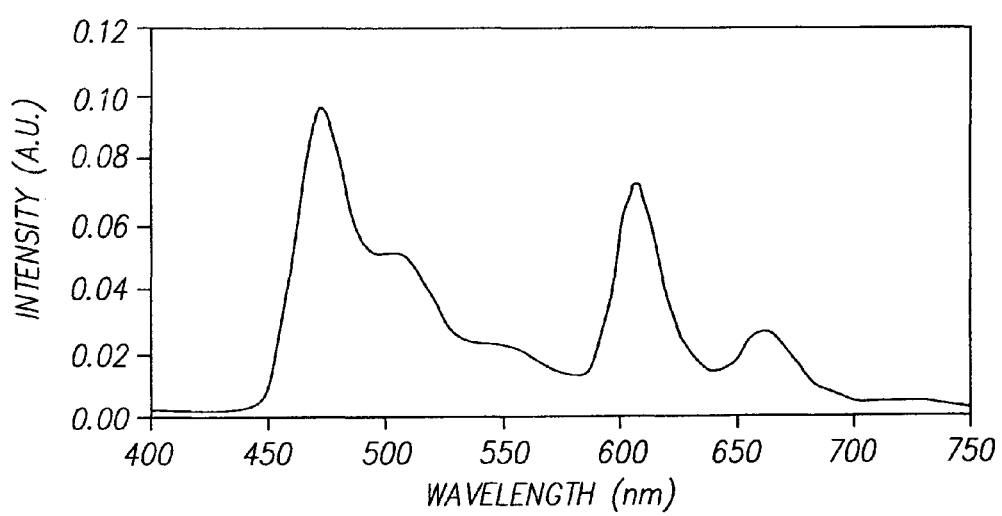
FIG. 2 is an EL spectrum of a white-emitting OLED device according to this invention.
Figure 3:
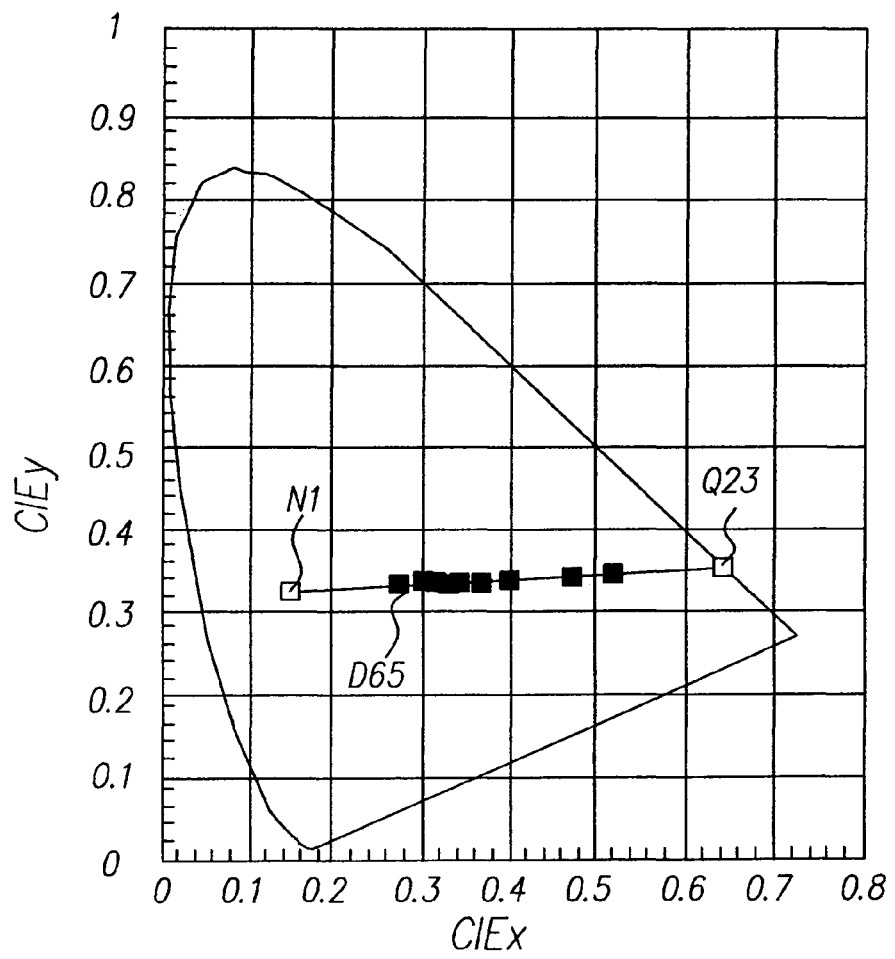
FIG. 3 is a CIEx,y plot of the devices based on the EL spectrum shown in FIG. 2.

The EL spectrum of device 2 is plotted in FIG. 2 showing the blue-green and red-orange peaks of the white EL spectrum. FIG. 3 shows the chromaticity plot using the combination of host and dopants of Examples 1-8. It essentially shows that a line-plot can be obtained in the CIEx, CIEy space, and that a desirable white point can be obtained for the white device, when the red-orange emitting layer contains a red-orange dopant of Formula Q23 and the blue-green emitting layer contains a blue-green dopant 2.5% 4-(di-p-tolylamino)-4'[(di-p-tolylamino)styryl]stilbene (Formula N1).

Examples 9 to 18

Examples 9 to 18 were prepared using a yellow-orange emitting layer using NPB host with Rubrene (Formula P3) or Rubrene derivative (Formula P4 or L50) as a yellow-orange dopant. There is also sometimes a stabilizer tBuDPN (Formula P6) in the yellow-orange emitting layer. The blue-emitting layer includes an anthracene host with NPB co-dopant and BEP blue-emitting dopant. Examples 9-18 were prepared similar to Example 1 with the exception of the composition of the yellow-orange emitting and blue-emitting layers.

The yellow layer includes a 28 nm layer of NPB (as host) with 2% to 5% yellow-orange dopant deposited on to the HTL layer to form a yellow-orange emitting first light-emitting layer. The yellow-orange layer also sometimes contains tBuDPN (Formula P6) stabilizer.

The blue layer includes a 47 nm layer of 9-(1-naphthyl)-10-(biphenyl-4-yl)anthracene (Blue Host-1) host with 0.8% to 1% BEP blue dopant and varying amounts of NPB co-dopant ranging from 7% to 10%. Blue Host-1, BEP and NPB were co-evaporatively deposited on the above substrate to form a blue-emitting second light-emitting layer.

The ETL and cathode layers were the same. The device was then transferred to a dry box for encapsulation.

Table 2 shows the device performance of Examples 9 to 18. It shows the device structure, luminance efficiency, chromaticity, drive voltage, and power consumption. The data given

TABLE 1

White device structure and data for Examples 1 to 8

| | Red-Orange EML (28 nm) | | | Blue-green EML (47 nm) | | | Performance | | | | RGBW | RGB |
| --- | --- | --- | --- | --- | --- | --- | --- | --- | --- | --- | --- | --- |
| Examples | HTL NPB (nm) | NPB % | Rubrene % | Red dopant (Q23) % | TBADN % | NPB % | Blue dopant (N1) % | Efficiency (cd/A) | CIEx | CIEy | Drive Voltage (V) | Avg Power (mW) | Avg Power (mW) |
| 1 | 240 | 71 | 28.6 | 0.4 | 91.1 | 6.4 | 2.5 | 11.2 | 0.40 | 0.33 | 9.0 | 371 | 613 |
| 2 | 240 | 71 | 28.6 | 0.4 | 89 | 8.5 | 2.5 | 12.0 | 0.37 | 0.33 | 8.7 | 280 | 534 |
| 3 | 240 | 71 | 28.6 | 0.4 | 86.9 | 10.6 | 2.5 | 12.1 | 0.35 | 0.33 | 8.5 | 250 | 532 |
| 4 | 240 | 71 | 28.6 | 0.4 | 84.8 | 12.7 | 2.5 | 11.3 | 0.32 | 0.33 | 8.2 | 271 | 586 |
| 5 | 240 | 71 | 28.6 | 0.4 | 84.8 | 12.7 | 2.5 | 11.4 | 0.33 | 0.33 | 8.4 | 264 | 574 |
| 6 | 240 | 71 | 28.6 | 0.4 | 82.7 | 14.8 | 2.5 | 10.6 | 0.32 | 0.33 | 8.0 | 304 | 626 |
| 7 | 240 | 71 | 28.6 | 0.4 | 80.5 | 17.0 | 2.5 | 9.4 | 0.31 | 0.33 | 7.8 | 375 | 730 |
| 8 | 240 | 71 | 28.6 | 0.4 | 84.8 | 12.7 | 2.5 | 11.0 | 0.28 | 0.33 | 9.1 | 369 | 733 |

The data given in Table 1 shows that the white point of the spectra can be varied and a white point close to D65 can be obtained by a suitable combination of the hosts/dopants. A white point close to D65 was obtained for the devices of Example 3 to 7. Also it can be seen that the lowest power consumption is obtained when the white point is closest to D65 and the efficiency is relatively high.

in Table 2 shows that the white point of the spectra can be varied and a white point close to D65 can be obtained by a suitable combination of the hosts/dopants. A white point close to D65 was obtained for the devices of Examples 9 to 11, and 15 to 16. Also it can be seen that the lowest power consumption is obtained when the white point is closest to D65, particularly true for the RGBW configuration.

TABLE 2

White device structure and data for Examples 9 to 18

| | Yellow-Orange EML (28 nm) | | | | Blue EML (47 nm) | | | Performance | | | | RGBW | RGB |
| | HTL | Co- | | | | | | | | | Drive | Avg | Avg |
| Examples | NPB (nm) | NPB % | dopant (P6) % | Yellow Dopant % | Host1 % | NPB % | BEP % | Efficiency (cd/A) | CIEx | CIEy | Voltage (V) | Power (mW) | Power (mW) |
|---|---|---|---|---|---|---|---|---|---|---|---|---|---|
| 9 | 220 | 96 | 2 | 2% Rubrene | 92 | 7 | 1 | 9.5 | 0.31 | 0.33 | 9.4 | 318 | 764 |
| 10 | 260 | 97 | 0 | 3% P4 | 92 | 7 | 1 | 10.6 | 0.33 | 0.29 | 9.0 | 350 | 559 |
| 11 | 250 | 97 | 0 | 3% P4 | 89.3 | 9.9 | 0.8 | 10.3 | 0.33 | 0.28 | 9.5 | 362 | 574 |
| 12 | 250 | 92 | 5 | 3% P4 | 89.3 | 9.9 | 0.8 | 11.7 | 0.37 | 0.32 | 9.5 | 396 | 552 |
| 13 | 250 | 87 | 10 | 3% P4 | 89.3 | 9.9 | 0.8 | 11.8 | 0.38 | 0.33 | 9.4 | 414 | 566 |
| 14 | 250 | 78 | 19 | 3% P4 | 89.3 | 9.9 | 0.8 | 12.3 | 0.39 | 0.34 | 9.1 | 436 | 581 |
| 15 | 260 | 98 | 0 | 2% L50 | 92.3 | 6.9 | 0.8 | 10.4 | 0.31 | 0.28 | 9.0 | 314 | 571 |
| 16 | 260 | 98 | 0 | 2% L50 | 92 | 7 | 1 | 10.4 | 0.32 | 0.28 | 9.0 | 333 | 576 |
| 17 | 260 | 97 | 0 | 3% L50 | 92 | 7 | 1 | 11.6 | 0.36 | 0.31 | 8.9 | 370 | 554 |
| 18 | 260 | 95 | 0 | 5% L50 | 92 | 7 | 1 | 11.7 | 0.38 | 0.32 | 8.9 | 421 | 567 |

Figure 4:
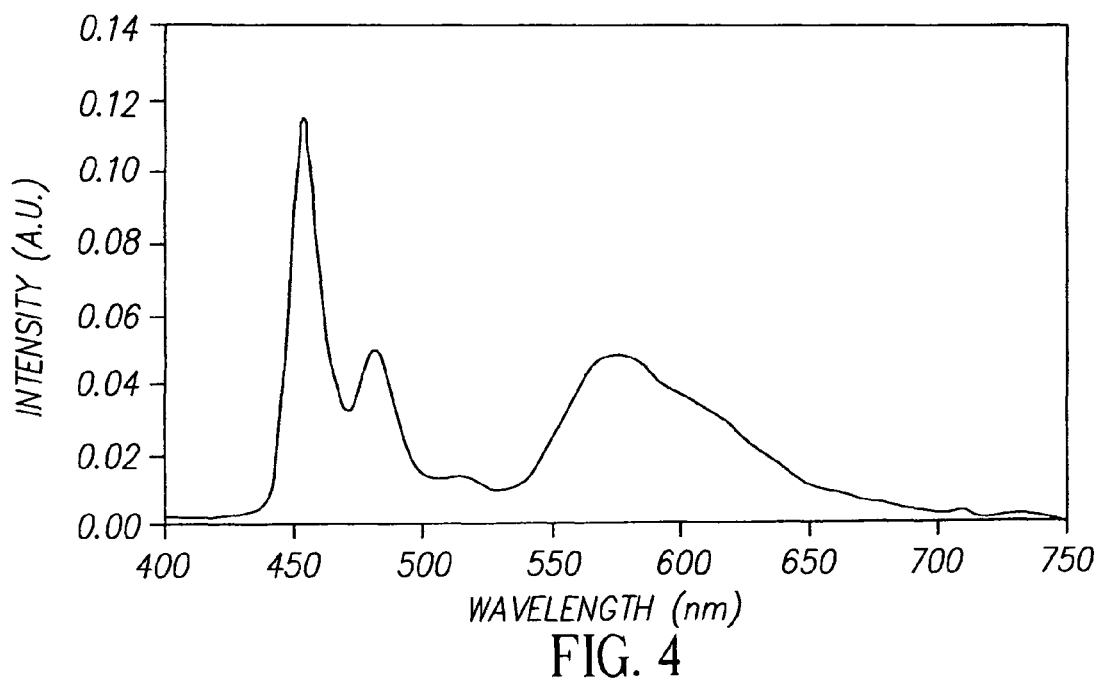
FIG. 4 is an EL spectrum of a white-emitting OLED device according to this invention.
Figure 5:
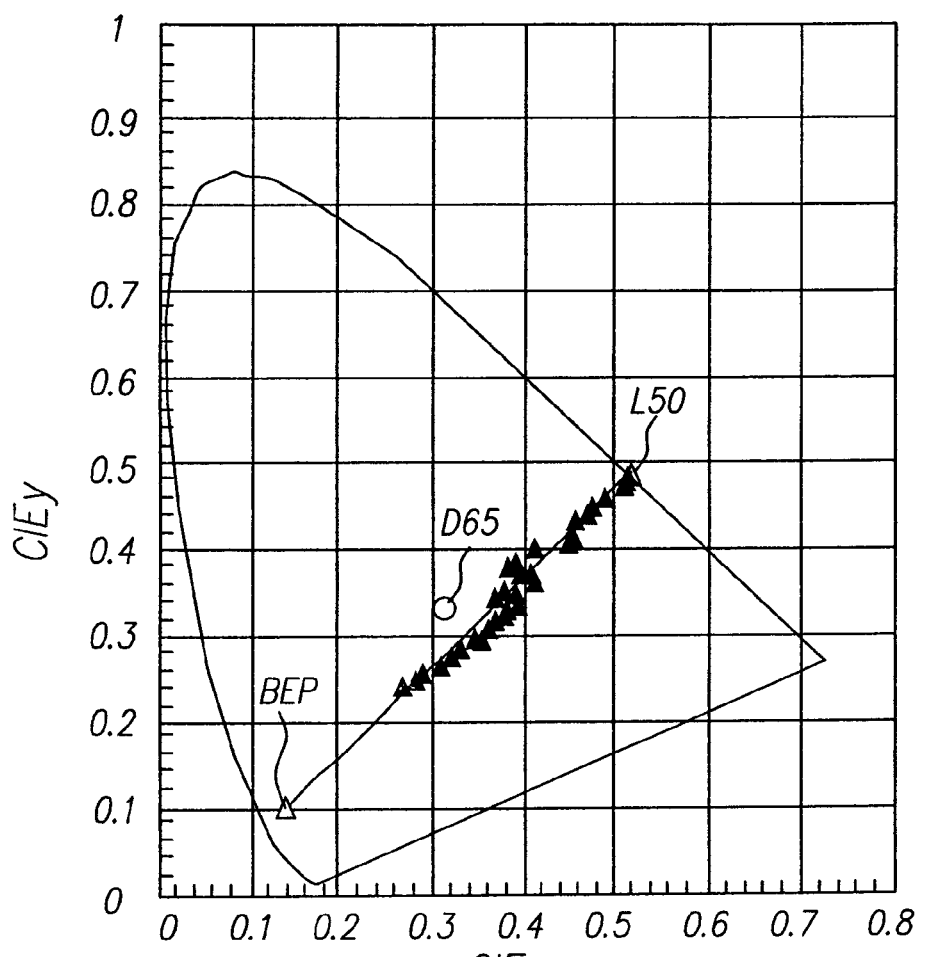
FIG. 5 is a CIEx,y plot of the devices based on the EL spectrum shown in FIG. 4.

FIG. 4 shows the EL spectrum of OLED device 10 and shows the blue and yellow-orange peaks of the white EL spectrum. FIG. 5 shows the chromaticity plot using the combination of hosts/dopants of Examples 9-18. It essentially shows that a line-plot can be obtained in the CIEx, CIEy space, and that a desirable white point can be obtained for the white device, when the yellow-orange emitting layer includes a yellow-orange emitting dopant such as Rubrene or Rubrene derivatives and the blue-emitting layer includes BEP blue dopant.

Examples 19 to 26

Examples 19 to 26 were prepared using a red-orange emitting layer using NPB host with Rubrene co-host and a red-orange dopant (Formula Q23). The blue-emitting layer includes an anthracene host such as Blue Host-1 or TBADN with BEP (as blue-emitting dopant) and NPB as co-dopant. All the devices were fabricated similar to Example 1 with the exception of the composition of the red-orange emitting and blue-emitting layers.

Table 3 shows the device performance of Examples 19 to 26. It shows the device structure, luminance efficiency, chromaticity, drive voltage, and power consumption. The data given in Table 3 shows that varying host/dopant combinations can vary the white point of the spectra but a white point close to D65 cannot be obtained by the combination of red-orange emitting and blue-emitting dopants given in Table 3. Also it can be seen that the power consumption predicted was much higher than that given in Table 1 or Table 2.

TABLE 3

White device structure and data for Examples 19 to 26

| | HTL | Red-Orange EML (28 nm) | | | Blue EML (43 nm) | | | Performance | | | | RGBW | RGB |
| | | | | | | | | | | | Drive | Avg | Avg |
| Examples | NPB (nm) | NPB % | Rubrene % | Red Dopant (Q23) % | Host 1 % | NPB % | BEP % | Efficiency (cd/A) | CIEx | CIEy | Voltage (V) | Power (mW) | Power (mW) |
|---|---|---|---|---|---|---|---|---|---|---|---|---|---|
| 19 | 240 | 71 | 28.5 | 0.5% | 94.6 (TBADN) | 4.7 | 0.7 | 6.2 | 0.33 | 0.22 | 9.7 | 902 | 1104 |
| 20 | 240 | 73.7 | 25.8 | 0.5% | 99.2 | 0 | 0.8 | 5.7 | 0.62 | 0.34 | 9.6 | 9321 | 8651 |
| 21 | 240 | 73.7 | 25.8 | 0.5% | 98.5 | 0 | 1.5 | 5.5 | 0.61 | 0.34 | 9.7 | 7755 | 7121 |
| 22 | 240 | 73.7 | 25.8 | 0.5% | 93.8 | 4.7 | 1.5 | 6.6 | 0.51 | 0.29 | 9.8 | 1996 | 1896 |
| 23 | 240 | 73.7 | 25.8 | 0.5% | 94.5 | 4.7 | 0.8 | 6.8 | 0.51 | 0.30 | 9.8 | 1977 | 1862 |
| 24 | 240 | 73.7 | 25.8 | 0.5% | 90.2 | 9 | 0.8 | 6.7 | 0.44 | 0.26 | 9.6 | 1119 | 1225 |
| 25 | 240 | 73.7 | 25.8 | 0.5% | 89.5 | 9 | 1.5 | 6.7 | 0.45 | 0.28 | 9.8 | 1188 | 1280 |
| 26 | 240 | 71.1 | 28.4 | 0.5% | 94.5 | 4.7 | 0.8 | 6.3 | 0.39 | 0.23 | 9.9 | 1139 | 1231 |

Figure 6:
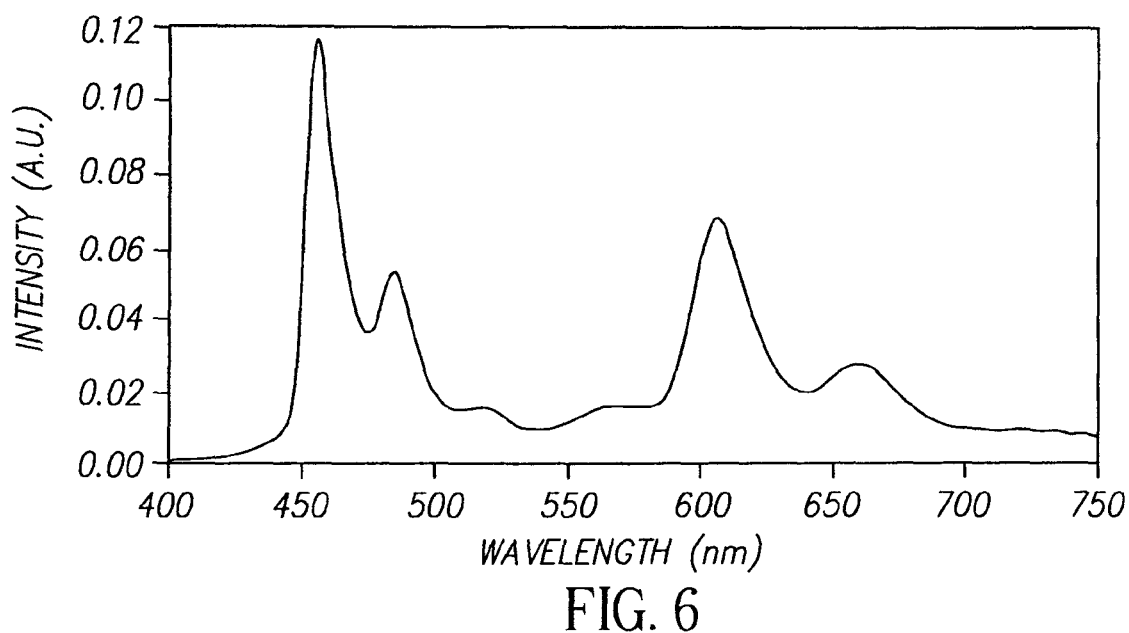
FIG. 6 is an EL spectrum of a white-emitting OLED device in accordance with the present invention.
Figure 7:
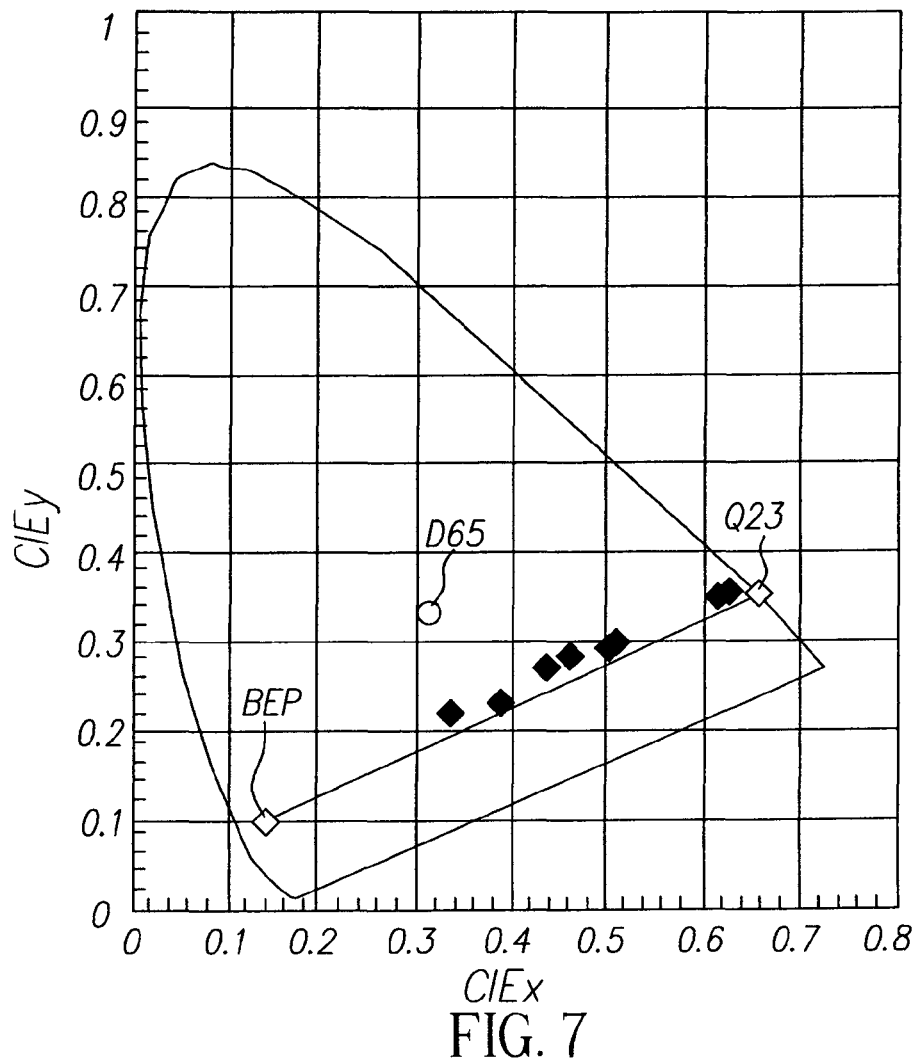
FIG. 7 is a CIEx,y plot of the devices based on the EL spectrum shown in FIG. 6.

FIG. 6 shows the EL spectrum of device 19 and shows the blue and red-orange peaks of the white EL spectrum. FIG. 7 shows the chromaticity plot of the white points obtained using the combination of blue and red-orange emitting dopants of Examples 19-26. The points lie on the line-plot connecting the color coordinates of the individual blue and red-orange dopants. But these white points are far from the desired D65 point.

Examples 27 to 39

Examples 27 to 39 were prepared using a yellow-orange emitting layer using NPB host with Rubrene (Formula P3) or Rubrene derivative (Formula P4 or L50) as a yellow-orange dopant. This forms a yellow-orange emitting first light-emitting layer. The yellow-orange layer also sometimes contains tBuDPN (Formula P6) stabilizer. The blue-green emitting layer includes TBADN host or Host-1, blue dopant 2.5%

4-(di-p-tolylamino)-4'-[(di-p-tolylamino)styryl]stilbene (Formula N1), and NPB as co-dopant. This forms a blue-green emitting second light-emitting layer. All the devices were fabricated similar to Example 1 with the exception of the composition of the yellow-orange emitting and blue-green emitting layers.

Table 4 shows the device performance of Examples 27 to 39. It shows the device structure, luminance efficiency, chromaticity, drive voltage, and power consumption. The data given in Table 4 shows that varying host/dopant combinations can vary the white point of the spectra but a white point close to D65 cannot be obtained by the combination of yellow-orange emitting and blue-green emitting dopants given in Table 3. Also it can be seen that the power consumption predicted was much higher than that given in Table 1 or Table 2.

60 electron-injecting layer
70 organic EL element
90 cathode

The invention claimed is:
1. An OLED device for producing white light, comprising:
a) an anode and a spaced cathode;
b) first and second light-emitting layers, the first having a blue light-emitting material which has a first point on a chromaticity diagram within a first area defined by CIEx=0.10 to 0.20, CIEy=0.05 to 0.15, the second layer having a yellow-orange light-emitting material which has a second point on a chromaticity diagram within a second area defined by CIEx=0.42 to 0.57; CIEy=0.42 to 0.57 such that, when a line is drawn between the first point and the second point, it passes through a desired

TABLE 4

White device structure and data for Examples 27 to 39

| | Yellow-Orange EML (31 nm) | | | | Blue-green EML | | | Performance | | | | RGBW | RGB |
|---|---|---|---|---|---|---|---|---|---|---|---|---|---|
| Examples | HTL NPB (nm) | NPB % | Co-dopant (P6) % | Yellow-orange Dopant % | Thickness (nm) | TBADN or Host1 % | NPB % | Blue dopant N1 % | Efficiency (cd/A) | CIEx | CIEy | Drive Voltage (V) | Avg Power (mW) | Avg Power (mW) |
| 27 | 170 | 77 | 20 | 3% P4 | 41 | 90.3 | 7.3 | 2.4 | 13.3 | 0.36 | 0.40 | 7.5 | 456 | 747 |
| 28 | 210 | 77 | 20 | 3% P4 | 41 | 90.3 | 7.3 | 2.4 | 17.0 | 0.39 | 0.45 | 7.9 | 696 | 866 |
| 29 | 250 | 77 | 20 | 3% P4 | 41 | 90.3 | 7.3 | 2.4 | 16.9 | 0.40 | 0.42 | 8.1 | 480 | 712 |
| 30 | 170 | 77 | 20 | 3% P4 | 41 | 90.3 | 7.3 | 2.4 | 14.1 | 0.36 | 0.41 | 7.1 | 476 | 738 |
| 31 | 120 | 87 | 10 | 3% L50 | 30.8 | 92.7 | 4.9 | 2.4 | 12.7 | 0.38 | 0.44 | 6.6 | 649 | 831 |
| 32 | 120 | 87 | 10 | 3% L50 | 51.3 | 87.8 | 9.8 | 2.4 | 12.4 | 0.29 | 0.41 | 7.3 | 609 | 785 |
| 33 | 120 | 89 | 10 | 1% L50 | 30.8 | 87.8 | 9.8 | 2.4 | 9.0 | 0.34 | 0.44 | 6.0 | 837 | 1059 |
| 34 | 120 | 89 | 10 | 1% L50 | 51.3 | 92.7 | 4.9 | 2.4 | 15.0 | 0.32 | 0.43 | 8.0 | 586 | 713 |
| 35 | 120 | 93 | 5 | 2% L50 | 41 | 90.3 | 7.3 | 2.4 | 12.9 | 0.30 | 0.42 | 7.0 | 595 | 764 |
| 36 | 120 | 99 | 0 | 1% L50 | 30.8 | 92.7 | 4.9 | 2.4 | 12.0 | 0.25 | 0.40 | 6.6 | 748 | 937 |
| 37 | 120 | 99 | 0 | 1% L50 | 51.3 | 87.8 | 9.8 | 2.4 | 12.5 | 0.22 | 0.39 | 7.3 | 832 | 999 |
| 38 | 120 | 97 | 0 | 3% L50 | 30.8 | 87.8 | 9.8 | 2.4 | 8.8 | 0.31 | 0.41 | 5.9 | 766 | 1007 |
| 39 | 120 | 97 | 0 | 3% L50 | 51.3 | 92.7 | 4.9 | 2.4 | 14.8 | 0.28 | 0.40 | 8.0 | 524 | 674 |

Figure 8:
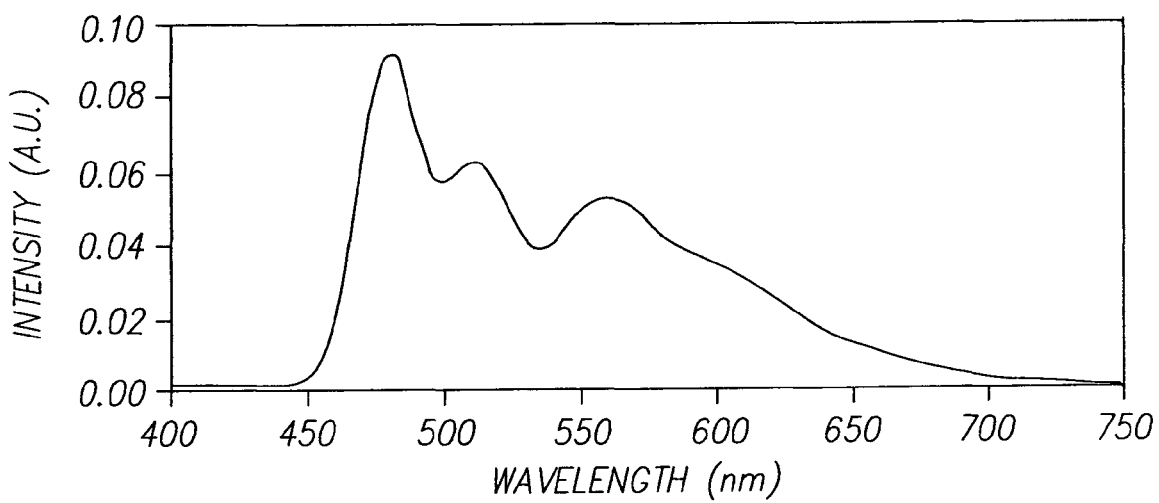
FIG. 8 is an EL spectrum of a white-emitting OLED device in accordance with the present invention.
Figure 9:
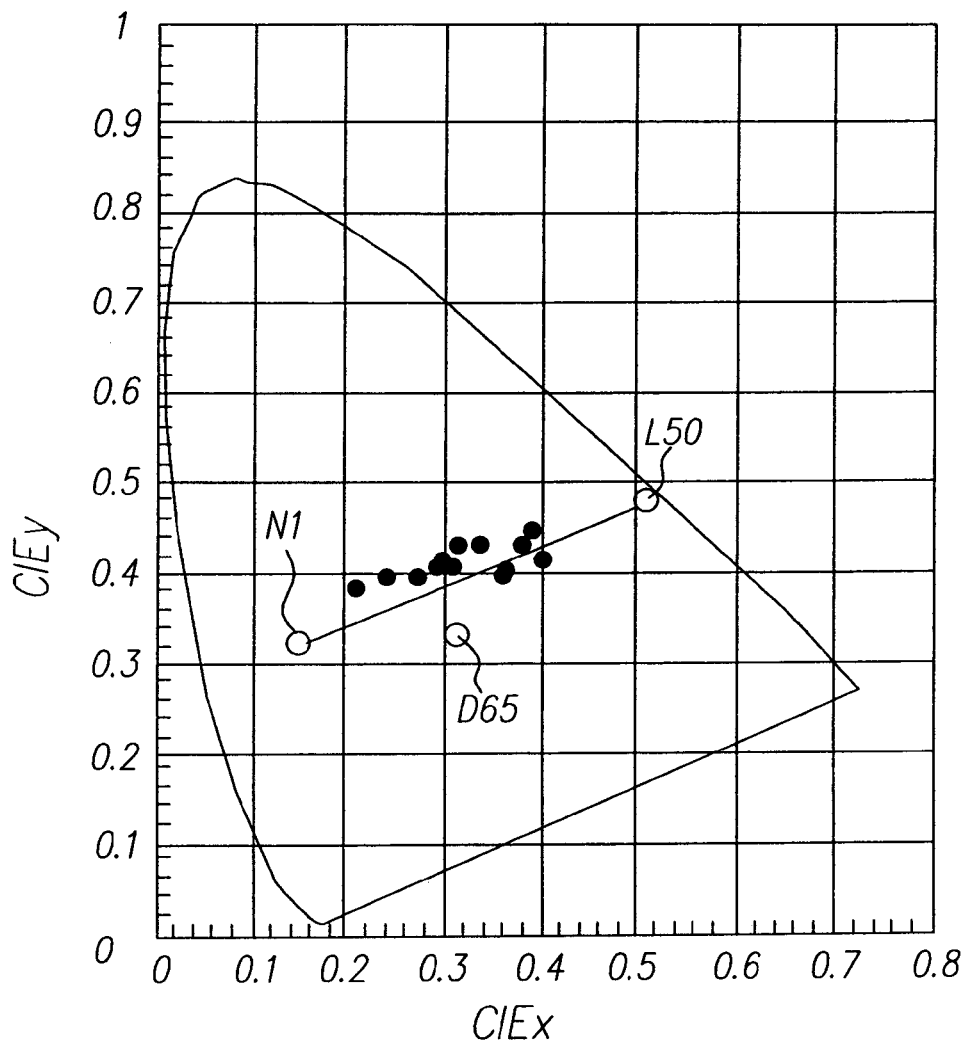
FIG. 9 is a CIEx,y plot of the devices based on the EL spectrum shown in FIG. 8.

FIG. 8 shows the EL spectrum of device 34 and shows the blue- and green and yellow-orange peaks of the white EL spectrum. FIG. 9 shows the chromaticity plot of the white points obtained using the combination of blue-green and yellow-orange emitting dopants of Examples 27-39. The points lie on the line-plot connecting the color coordinates of the individual blue-green and yellow-orange dopants. But these white points are far from the desired D65 point.

The invention has been described in detail with particular reference to certain preferred embodiments thereof, but it will be understood that variations and modifications can be effected within the spirit and scope of the invention.

PARTS LIST

10 OLED device
20 substrate
25 color filter
30 anode
35 hole-injecting layer
40 hole-transporting layer
45 first light-emitting layer
50 second light-emitting layer
55 electron-transporting layer white area defined on a chromaticity diagram to be within CIEx=0.27 to 0.39, CIEy=0.27 to 0.39;
c) the concentration of the selected first and second materials being such that the white light produced by the OLED device is at a third point substantially on the line in the chromaticity diagram within the desired white area;
wherein the blue light emitting material includes perylene or derivatives thereof or a compound of the structure:

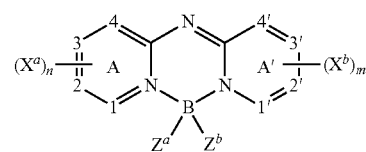

wherein:
A and A' represent independent azine ring systems corresponding to 6-membered aromatic ring systems containing at least one nitrogen;
$(X^a)_n$ and $(X^b)_m$ represent one or more independently selected substituents and include acyclic substituents or are joined to form a ring fused to A or A';

m and n are independently 0 to 4;

$Z^a$ and $Z^b$ are independently selected substituents;

1, 2, 3, 4, 1', 2', 3', and 4' are independently selected as either carbon or nitrogen atoms;

provided that $X^a$, $X^b$, $Z^a$, and $Z^b$, 1, 2, 3, 4, 1', 2', 3', and 4' are selected to provide blue luminescence; and the yellow-orange light emitting material includes a compound of the following structures:

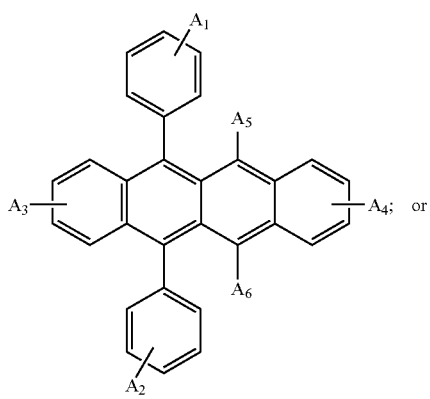

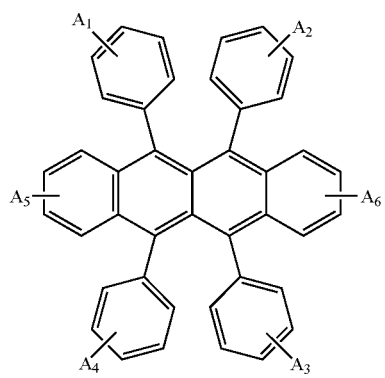

wherein $A_1$-$A_6$ represent one or more substituents on each ring and where each substituent is individually selected from one of the following:

Category 1: hydrogen, or alkyl of from 1 to 24 carbon atoms;

Category 2: aryl or substituted aryl of from 5 to 20 carbon atoms;

Category 3: hydrocarbon containing 4 to 24 carbon atoms, completing a fused aromatic ring or ring system;

Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;

Category 5: alkoxylamino, alkylamino, or arylamino of from 1 to 24 carbon atoms; or Category 6: fluoro, chloro, bromo or cyano.

2. The OLED device of claim 1 wherein the blue light emitting material is BEP

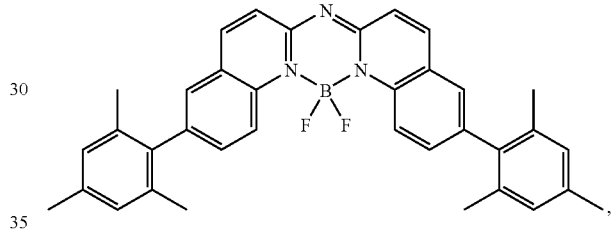

and the yellow-orange light emitting material is one or more of the following yellow-orange dopants: 5,6,11,12-tetraphenylnaphthacene (Rubrene); 6,11-diphenyl-5,12-bis(4-(6-methyl-benzothiazol-2-yl)phenyl)naphthacene (DBzR); 5,6,11,12-tetra(2-naphthyl)-naphthacene (NR); Formula L49; or Formula L50; the formulas of which are shown below:

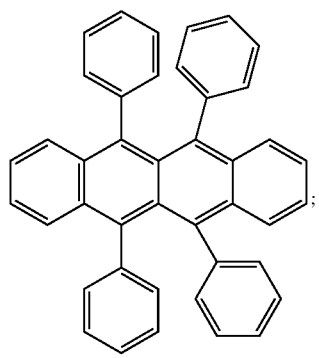

(Rubrene, P3)

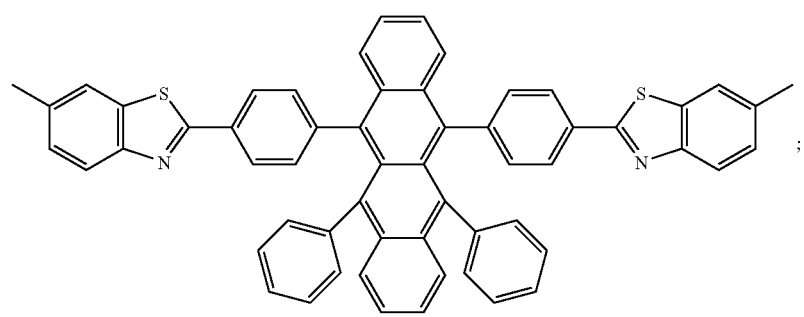

(DBzR, P4)

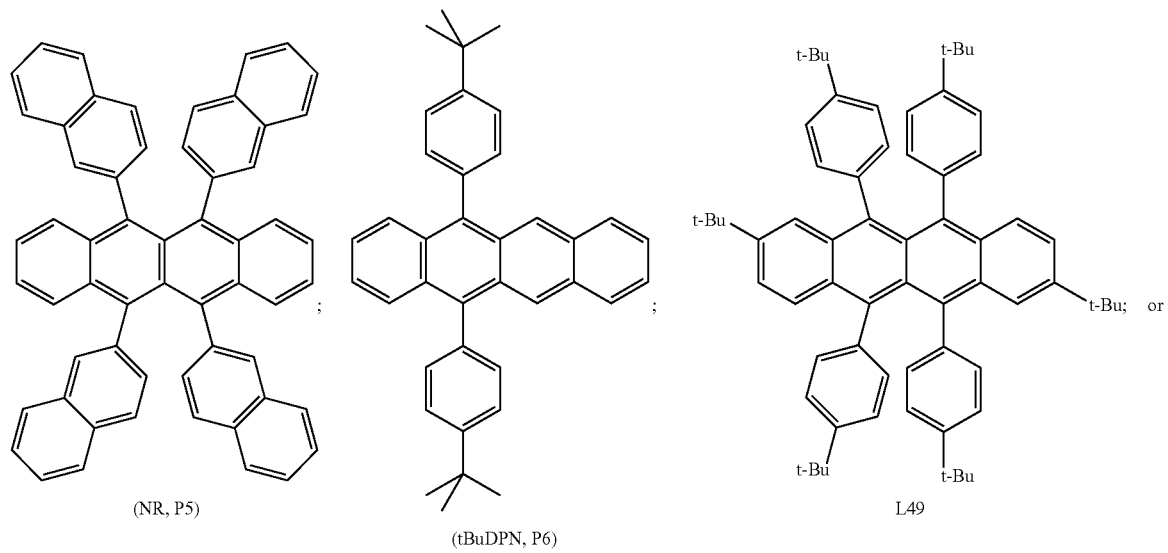

(NR, P5); (tBuDPN, P6); L49; or

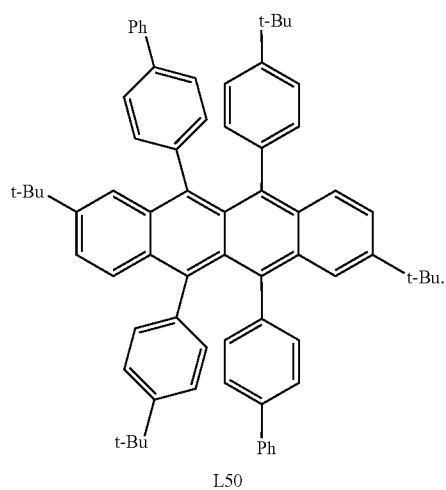

L50

3. An OLED device with a blue light-emitting material and a yellow-orange light-emitting material which combine to produce white light, and color filters which receive white light and respectively produce red, green, and blue light comprising:

a) a blue light-emitting material which has a first point on a chromaticity diagram within a first area defined by CIEx=0.10 to 0.20, CIEy=0.05 to 0.15;

b) a yellow-orange light-emitting material which has a second point on a chromaticity diagram within a second area defined by CIEx=0.42 to 0.57, CIEy=0.42 to 0.57 such that, when a line is drawn between the first point and the second point, it passes through a desired white area defined on a chromaticity diagram to be within CIEx=0.27 to 0.39, CIEy=0.27 to 0.39;

c) selecting the concentration of the blue light-emitting material or the yellow-orange light-emitting material, or both, so that the white light produced by the OLED device is at a third point substantially on the line in the chromaticity diagram within the desired white area;

d) providing the red, green, and blue filters;

wherein the blue light emitting material includes perylene or derivatives thereof or a compound of the structure:

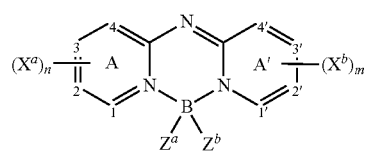

wherein:
A and A' represent independent azine ring systems corresponding to 6-membered aromatic ring systems containing at least one nitrogen;
$(X^a)_n$ and $(X^b)_m$ represent one or more independently selected substituents and include acyclic substituents or are joined to form a ring fused to A or A';
m and n are independently 0 to 4;
$Z^a$ and $Z^b$ are independently selected substituents;
1, 2, 3, 4, 1', 2', 3', and 4' are independently selected as either carbon or nitrogen atoms; and
provided that $X^a$, $X^b$, $Z^a$, and $Z^b$, 1, 2, 3, 4, 1', 2', 3', and 4' are selected to provide blue luminescence; and
and the yellow-orange light emitting material includes a compound of the following structures:

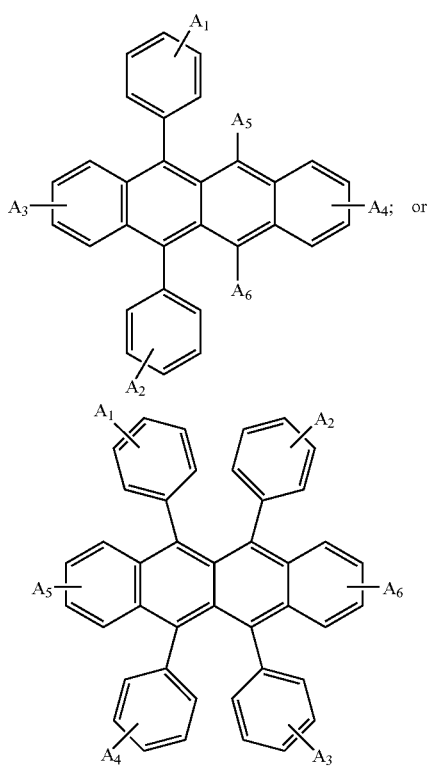

wherein $A_1$-$A_6$ represent one or more substituents on each ring and where each substituent is individually selected from one of the following:

Category 1: hydrogen, or alkyl of from 1 to 24 carbon atoms;

Category 2: aryl or substituted aryl of from 5 to 20 carbon atoms;

Category 3: hydrocarbon containing 4 to 24 carbon atoms, completing a fused aromatic ring or ring system;

Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;

Category 5: alkoxylamino, alkylamino, or arylamino of from 1 to 24 carbon atoms; or Category 6: fluoro, chloro, bromo or cyano.

4. The OLED according to claim 3 wherein the blue light emitting material is BEP

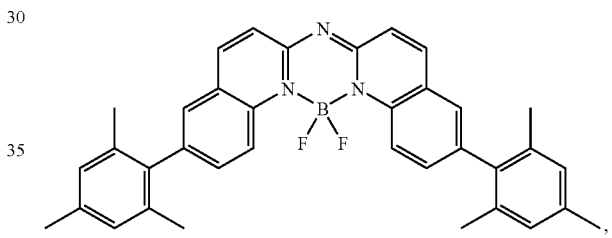

and the yellow-orange light emitting material is one or more of the following yellow-orange dopants: 5,6,11,12-tetraphenylnaphthacene (Rubrene); 6,11-diphenyl-5,12-bis(4-(6-methyl-benzothiazol-2-yl)phenyl)naphthacene (DBzR), 5,6,11,12-tetra(2-naphthyl)-naphthacene (NR), Formula L49, or Formula L50, the formulas of which are shown below:

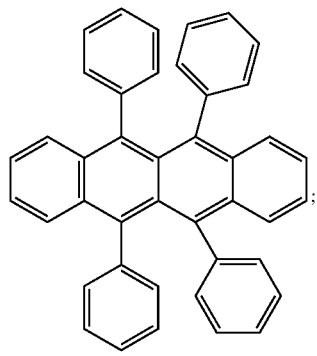

(Rubrene, P3)

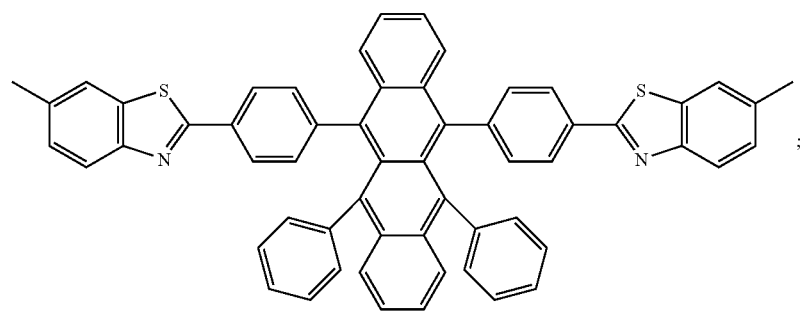

(DBzR, P4)

-continued
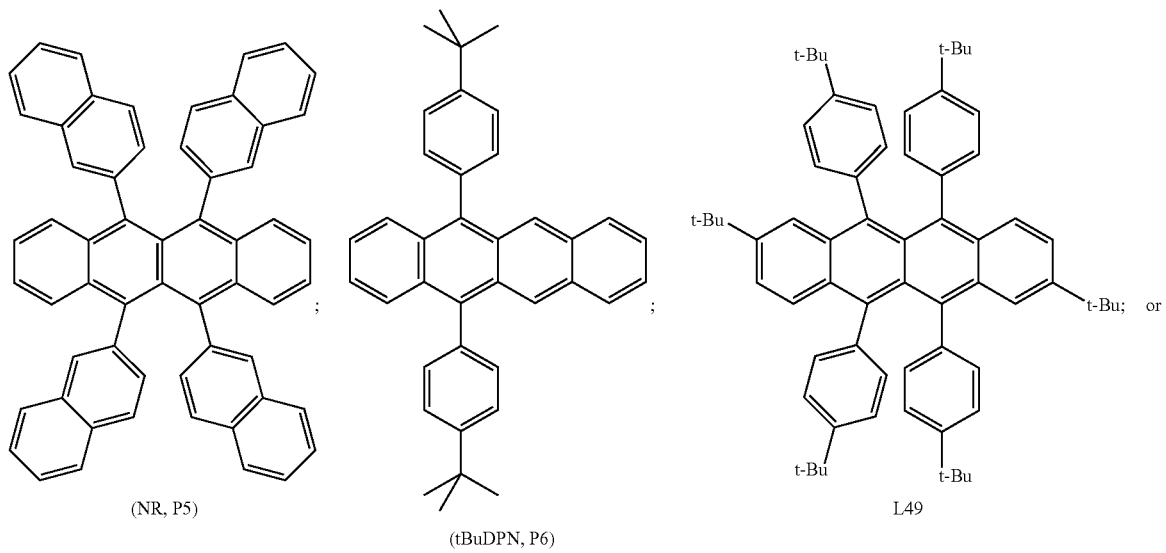
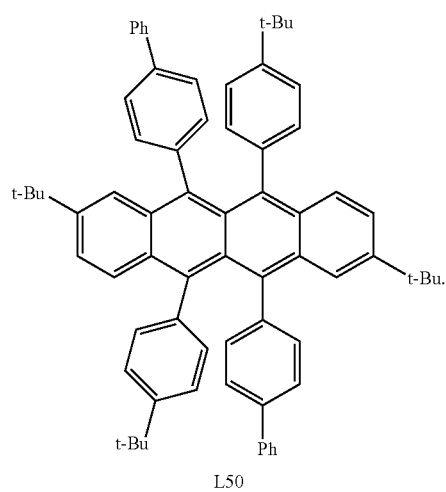
5. The OLED device of claim 3 wherein the filters leave an unfiltered portion so that the OLED device also produces white light pixels.
6. The OLED device according to claim 5 wherein the blue light emitting material is BEP
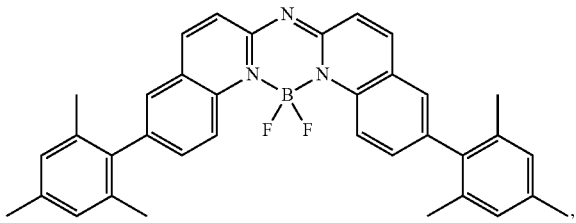

and the yellow-orange light emitting material is one or more of the following yellow-orange dopants: 5,6,11,12-tetraphenylnaphthacene (Rubrene); 6,11-diphenyl-5,12-bis(4-(6-methyl-benzothiazol-2-yl)-phenyl)naphthacene (DBzR), 5,6,11,12-tetra(2-naphthyl)-naphthacene (NR), Formula L49, or Formula L50, the formulas of which are shown below:
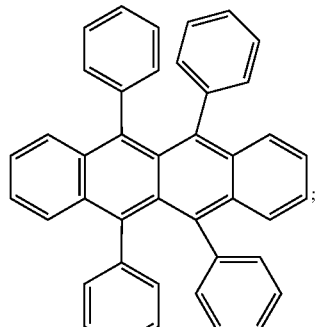
(Rubrene)
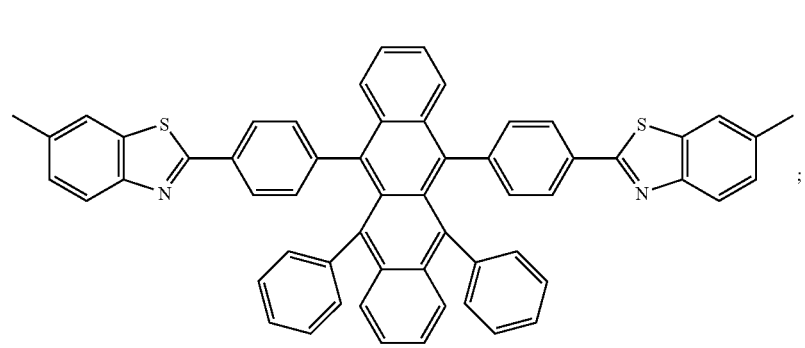
(DBzR)
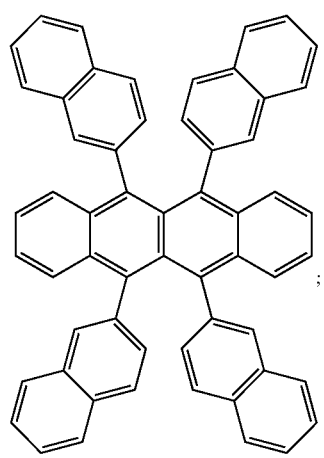
(NR)
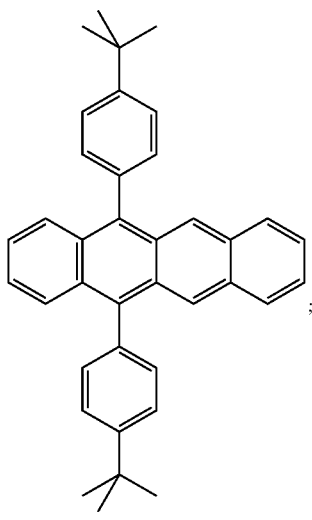
(tBuDPN)
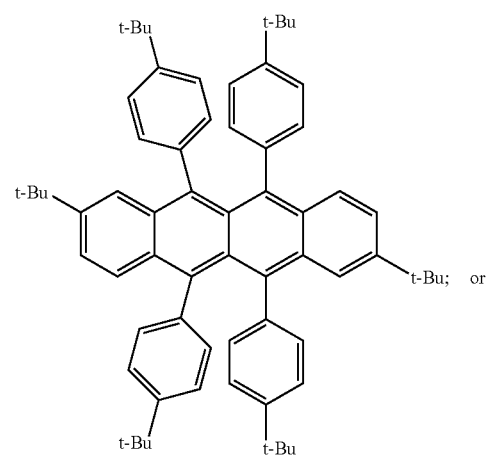
L49
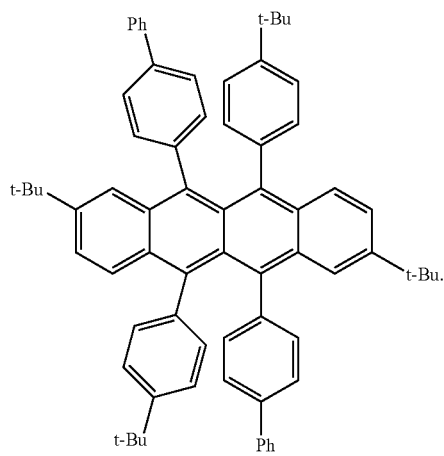
L50
* * * * *

UNITED STATES PATENT AND TRADEMARK OFFICE
CERTIFICATE OF CORRECTION

| | | |
|---|---|---|
| PATENT NO. | : 8,179,035 B2 | Page 1 of 1 |
| APPLICATION NO. | : 11/959493 | |
| DATED | : May 15, 2012 | |
| INVENTOR(S) | : Jeffrey P. Spindler et al. | |

It is certified that error appears in the above-identified patent and that said Letters Patent is hereby corrected as shown below:

At column 24, line 11 of the Patent, please insert --tBuDPN,-- between "(NR)," and "and"

At column 54, line 44 (Claim 2) of the Patent, please insert --tBuDPN;-- between "(NR);" and "Formula"

At column 58, line 48 (Claim 4) of the Patent, please insert --tBuDPN,-- between "(NR)," and "Formula"

At column 62, line 2 (Claim 6) of the Patent, please insert --tBuDPN,-- between "(NR)," and "Formula"

Signed and Sealed this
Seventh Day of August, 2012

David J. Kappos
*Director of the United States Patent and Trademark Office*